(12) United States Patent
Weber et al.

(10) Patent No.: US 9,583,668 B2
(45) Date of Patent: Feb. 28, 2017

(54) SEMICONDUCTOR DEVICE

(75) Inventors: Klaus Johannes Weber, Aranda (AU); Andrew William Blakers, Aranda (AU)

(73) Assignee: The Australian National University, Acton (AU)

( * ) Notice: Subject to any disclaimer, the term of this patent is extended or adjusted under 35 U.S.C. 154(b) by 428 days.

(21) Appl. No.: 12/822,055

(22) Filed: Jun. 23, 2010

(65) Prior Publication Data
US 2010/0258161 A1 Oct. 14, 2010

Related U.S. Application Data

(63) Continuation of application No. 10/432,936, filed as application No. PCT/AU01/01546 on Nov. 29, 2001, now Pat. No. 7,875,794.

(30) Foreign Application Priority Data

Nov. 29, 2000 (AU) ...................................... PR1748

(51) Int. Cl.
*H01L 31/18* (2006.01)
*H01L 31/068* (2012.01)
(Continued)

(52) U.S. Cl.
CPC .. *H01L 31/1804* (2013.01); *H01L 31/035281* (2013.01); *H01L 31/0504* (2013.01);
(Continued)

(58) Field of Classification Search
CPC ............. H01L 31/1804; H01L 31/0547; H01L 31/035281; H01L 31/0504; H01L 31/068; H01L 31/18; H01L 31/1876
See application file for complete search history.

(56) References Cited

U.S. PATENT DOCUMENTS 3,278,811 A  10/1966  Mori
3,422,527 A   1/1969  Gault
(Continued)

FOREIGN PATENT DOCUMENTS

DE  3803769   8/1989
DE  19650111  6/1998
(Continued)

OTHER PUBLICATIONS

Blakers et al., "Sliver Cells—A Complete Photovoltaic Solution," 2006 IEEE 4th World Conference on Photovoltaic Energy Conversion, May 7-12, 2006, 4 pages.
(Continued)

*Primary Examiner* — Jarrett Stark
(74) *Attorney, Agent, or Firm* — Baker & Hostetler LLP

(57) ABSTRACT

The invention provides a method for increasing the usable surface area of a semiconductor wafer having a substantially planar surface and a thickness dimension at right angles to said substantially planar surface, the method including the steps of selecting a strip thickness for division of the wafer into a plurality of strips, selecting a technique for cutting the wafer into the strips at an angle to the substantially planar surface, in which the combined strip thickness and width of wafer removed by the cutting is less than the thickness of the wafer, cutting the wafer into strips using the selected technique and separating the strips from each other.

26 Claims, 16 Drawing Sheets

(51) Int. Cl.
  *H01L 31/0352*   (2006.01)
  *H01L 31/05*     (2014.01)
  *H01L 31/054*    (2014.01)

(52) U.S. Cl.
  CPC ........ *H01L 31/0547* (2014.12); *H01L 31/068* (2013.01); *H01L 31/18* (2013.01); *H01L 31/1876* (2013.01); *Y02E 10/52* (2013.01); *Y02E 10/547* (2013.01); *Y02P 70/521* (2015.11)

(56) References Cited

U.S. PATENT DOCUMENTS

| | | | |
|---|---|---|---|
| 3,647,581 A | 3/1972 | Mash | |
| 3,690,953 A | 9/1972 | Wise | |
| 3,985,579 A | 10/1976 | Rahilly | |
| 4,038,104 A | 7/1977 | Tsutomu | |
| 4,082,570 A | 4/1978 | House et al. | |
| 4,110,122 A | 8/1978 | Kaplow et al. | |
| 4,153,476 A | 5/1979 | Frosch et al. | |
| 4,278,473 A | 7/1981 | Borden | |
| 4,283,589 A * | 8/1981 | Kaplow et al. | 136/249 |
| 4,332,973 A | 6/1982 | Sater | |
| 4,406,913 A | 9/1983 | Weyrich | |
| 4,409,422 A | 10/1983 | Sater | |
| 4,409,423 A | 10/1983 | Holt | |
| 4,444,992 A | 4/1984 | Cox, III | |
| 4,516,314 A | 5/1985 | Sater | |
| 4,527,183 A | 7/1985 | Anthony et al. | |
| 4,554,727 A | 11/1985 | Deckman et al. | |
| 4,626,613 A | 12/1986 | Wenham et al. | |
| 4,633,031 A | 12/1986 | Todorof | |
| 4,686,321 A | 8/1987 | Kishi | |
| 4,692,782 A | 9/1987 | Seki et al. | |
| 4,773,944 A * | 9/1988 | Nath et al. | 136/249 |
| 4,805,006 A | 2/1989 | Yamaguchi et al. | |
| 4,883,561 A | 11/1989 | Gmitter et al. | |
| 4,892,592 A | 1/1990 | Dickson et al. | |
| 4,982,099 A | 1/1991 | Lischke | |
| 4,989,059 A | 1/1991 | Micheels et al. | |
| 5,011,544 A | 4/1991 | Gaddy et al. | |
| 5,016,073 A | 5/1991 | Elliott et al. | |
| 5,067,985 A | 11/1991 | Carver et al. | |
| 5,073,230 A | 12/1991 | Maracas et al. | |
| 5,081,049 A | 1/1992 | Green et al. | |
| 5,082,791 A | 1/1992 | Micheels et al. | |
| 5,098,482 A | 3/1992 | Warfield | |
| 5,116,464 A | 5/1992 | Edell et al. | |
| 5,136,346 A | 8/1992 | Kornowski | |
| 5,139,974 A | 8/1992 | Sandhu et al. | |
| 5,149,676 A | 9/1992 | Kim et al. | |
| 5,209,118 A | 5/1993 | Jerman | |
| 5,254,179 A * | 10/1993 | Ricaud et al. | 136/244 |
| 5,266,125 A | 11/1993 | Rand et al. | |
| 5,279,703 A | 1/1994 | Haberger et al. | |
| 5,306,647 A | 4/1994 | Lehmann et al. | |
| 5,324,679 A | 6/1994 | Kim et al. | |
| 5,330,584 A | 7/1994 | Saga et al. | |
| 5,344,517 A | 9/1994 | Houlding | |
| 5,352,530 A | 10/1994 | Tanuma et al. | |
| 5,367,217 A | 11/1994 | Norling | |
| 5,389,158 A | 2/1995 | Fraas et al. | |
| 5,391,236 A | 2/1995 | Krut et al. | |
| 5,447,576 A | 9/1995 | Willis | |
| 5,461,002 A | 10/1995 | Safir | |
| 5,466,302 A | 11/1995 | Carey et al. | |
| 5,470,761 A | 11/1995 | McKee et al. | |
| 5,474,620 A | 12/1995 | Nath et al. | |
| 5,478,402 A | 12/1995 | Hanoka | |
| 5,494,832 A | 2/1996 | Lehmann et al. | |
| 5,538,563 A | 7/1996 | Finkl | |
| 5,538,902 A | 7/1996 | Izu et al. | |
| 5,567,248 A | 10/1996 | Chung | |
| 5,567,656 A | 10/1996 | Chun | |
| 5,609,694 A | 3/1997 | Asai | |
| 5,641,381 A | 6/1997 | Bailey et al. | |
| 5,733,382 A | 3/1998 | Hanoka | |
| 5,773,791 A | 6/1998 | Kuykendal | |
| 5,851,928 A | 12/1998 | Cripe et al. | |
| 5,852,322 A | 12/1998 | Speckbacher | |
| 5,895,530 A | 4/1999 | Shrotriya et al. | |
| 5,902,120 A | 5/1999 | Igel et al. | |
| 5,904,546 A | 5/1999 | Wood et al. | |
| 5,904,548 A | 5/1999 | Orcutt et al. | |
| 5,930,644 A | 7/1999 | Tsai et al. | |
| 5,972,732 A | 10/1999 | Gee et al. | |
| 5,985,742 A | 11/1999 | Henley et al. | |
| 5,994,641 A | 11/1999 | Kardauskas | |
| 5,997,713 A | 12/1999 | Beetz, Jr. et al. | |
| 6,005,276 A | 12/1999 | Forrest et al. | |
| 6,008,449 A | 12/1999 | Cole | |
| 6,066,516 A | 5/2000 | Miyasaka et al. | |
| 6,069,313 A * | 5/2000 | Kay | 136/249 |
| 6,074,514 A | 6/2000 | Bjorkman | |
| 6,091,021 A | 7/2000 | Ruby et al. | |
| 6,107,161 A | 8/2000 | Kitaguro et al. | |
| 6,110,793 A | 8/2000 | Lee et al. | |
| 6,126,311 A | 10/2000 | Schuh | |
| 6,127,623 A | 10/2000 | Nakamura et al. | |
| 6,127,714 A | 10/2000 | Mochizuki | |
| 6,130,380 A | 10/2000 | Kakamura | |
| 6,140,603 A | 10/2000 | Hwang et al. | |
| 6,143,976 A | 11/2000 | Endrös | |
| 6,156,620 A | 12/2000 | Puchner et al. | |
| 6,156,967 A | 12/2000 | Ralph et al. | |
| 6,156,968 A | 12/2000 | Nishimoto et al. | |
| 6,162,658 A | 12/2000 | Green et al. | |
| 6,166,318 A | 12/2000 | Freeouf | |
| 6,168,968 B1 | 1/2001 | Umemoto et al. | |
| 6,172,297 B1 | 1/2001 | Hezel et al. | |
| 6,180,869 B1 | 1/2001 | Meier et al. | |
| 6,184,457 B1 | 2/2001 | Tsuzuki et al. | |
| 6,262,358 B1 | 7/2001 | Kamimura et al. | |
| 6,265,653 B1 | 7/2001 | Haigh et al. | |
| 6,265,741 B1 | 7/2001 | Schrems | |
| 6,294,722 B1 * | 9/2001 | Kondo et al. | 136/244 |
| 6,294,723 B2 | 9/2001 | Uematsu et al. | |
| 6,316,281 B1 | 11/2001 | Lee et al. | |
| 6,320,115 B1 | 11/2001 | Kataoka et al. | |
| 6,320,116 B1 | 11/2001 | Hanoka | |
| 6,323,415 B1 | 11/2001 | Uematsu et al. | |
| 6,406,979 B2 | 6/2002 | Fischer et al. | |
| 6,407,327 B1 | 6/2002 | Ralp et al. | |
| 6,407,329 B1 | 6/2002 | Lino et al. | |
| 6,410,843 B1 | 6/2002 | Kishi et al. | |
| 6,455,873 B1 | 9/2002 | Lonergan | |
| 6,479,744 B1 | 11/2002 | Tsuzuki et al. | |
| 6,492,704 B1 | 12/2002 | Coroy | |
| 6,515,217 B1 | 2/2003 | Aylaian | |
| 6,515,218 B1 | 2/2003 | Shimizu et al. | |
| 6,525,374 B1 | 2/2003 | Sittig et al. | |
| 6,553,729 B1 | 4/2003 | Nath et al. | |
| 6,583,032 B1 | 6/2003 | Ishikawa et al. | |
| 6,663,944 B2 | 12/2003 | Park et al. | |
| 6,846,984 B2 | 1/2005 | Fath et al. | |
| 7,595,543 B2 | 9/2009 | Weber et al. | |
| 7,828,983 B2 | 11/2010 | Weber et al. | |
| 2001/0013630 A1 | 8/2001 | Cho et al. | |
| 2004/0097012 A1 | 5/2004 | Weber et al. | |
| 2004/0119067 A1 | 6/2004 | Weeks et al. | |
| 2005/0104163 A1 | 5/2005 | Weber et al. | |
| 2005/0272225 A1 | 12/2005 | Weber et al. | |
| 2010/0267218 A1 | 10/2010 | Weber et al. | |
| 2010/0269899 A1 | 10/2010 | Weber et al. | |

FOREIGN PATENT DOCUMENTS

| | | |
|---|---|---|
| DE | 19907506 | 9/1999 |
| EP | 0083510 | 7/1983 |
| EP | 0718873 | 6/1996 |
| EP | 0991129 | 4/2000 |
| EP | 1182710 | 2/2002 |
| EP | 1461834 | 9/2004 |
| GB | 1383165 | 1/1975 |

(56) References Cited

FOREIGN PATENT DOCUMENTS

| | | |
|---|---|---|
| JP | 53073075 | 6/1978 |
| JP | 58010873 | 1/1983 |
| JP | 59059883 | 4/1984 |
| JP | 59123279 | 7/1984 |
| JP | 59123283 | 7/1984 |
| JP | 61108176 | 5/1986 |
| JP | 62054927 | 3/1987 |
| JP | 63295500 | 12/1988 |
| JP | 07188947 | 7/1995 |
| JP | 7302890 | 11/1995 |
| JP | 8274371 | 10/1996 |
| JP | 10193338 | 7/1998 |
| JP | 11068131 | 3/1999 |
| JP | 11074234 | 3/1999 |
| JP | 11090923 | 4/1999 |
| JP | 11163284 | 6/1999 |
| JP | 11236689 | 8/1999 |
| JP | 11312815 | 11/1999 |
| JP | 11312816 | 11/1999 |
| JP | 00036609 | 2/2000 |
| JP | 00101111 | 4/2000 |
| JP | 00261008 | 9/2000 |
| JP | 00277763 | 10/2000 |
| JP | 01257371 | 9/2001 |
| JP | 01332529 | 11/2001 |
| JP | 02217439 | 8/2002 |
| JP | 0306824 | 1/2003 |
| JP | 03276682 | 10/2003 |
| JP | 0655733 | 3/2006 |
| JP | 06213554 | 8/2006 |
| JP | 09219531 | 10/2009 |
| WO | WO 98/09318 | 3/1998 |
| WO | WO 98/24119 | 6/1998 |
| WO | WO 98/25312 | 6/1998 |
| WO | WO 98/32164 | 7/1998 |
| WO | WO 00/28602 | 5/2000 |
| WO | WO 00/62348 | 10/2000 |
| WO | WO 00/73090 | 12/2000 |
| WO | WO 02/45143 | 6/2002 |
| WO | WO 03/047004 | 6/2003 |
| WO | WO 03/049201 | 6/2003 |

OTHER PUBLICATIONS

Blakers et al., "Sliver® Modules—A Crystalline Silicon Technology of the Future," 19th European PV Solar Energy Conference, Mar. 10, 2005, 4 pages.

Chien et al., "Nanometer-scale conversion of Si3N4 to SiOx", Applied Physics Letter, AIP, American Institute of Physics, Melville, NY, Jan. 17, 2000, 76(3), 360-362.

JP 63-295500 A (Shinetsu Chemical Industries KK), Dec. 1, 1988, 1 page.

JP 8-274371 A (Toyoda Gosei KK), Oct. 18, 1996, 3 pages.

JP 10-193338 A (Sumitomo Metal Mining Co.), Jul. 28, 1998, 2 pages.

JP 11-074234 A (Super Silicon Kenyusho KK), Mar. 16, 1999, 2 pages.

JP 11-090923 A (Hitachi Cable Ltd.), Apr. 6, 1999, 2 pages.

Einhaus et al., "Isotropic Texturing of Multicrystalline Silicon Wafers with Acidic Texturing Solutions", IEEE, 26th Photovoltaic Specialists Conference, Anaheim, CA, Sep. 29-Oct. 30, 1997, 167-170.

Ho et al., "Recent Developments in Thin Silicon Solar Cells", NASA; Lewis Research Center space Photovoltaic Res. and Technol.; High Efficiency, Radiation Damage and Blanket Technol., 1982, 17-24.

Iles and Soclof, "Silicon Solar Cells Formed by Orientation-Dependent Slicing", IEEE; Proceedings of the 15th Photovoltaic Specialists Conference, Kissimmee, Florida, May 12-15, 1981, 115-119.

Laurell et al., "Improvements silicon integrated GOx micro enzyme reactors by the use of porous silicon as a surface enlarging matrix", 18th Annual International Conference of the IEEE Engineering in Medicine and Biology Society, Oct. 31, 1996, 1.6.2: Microfabrication II, 262-263.

Lehmann et al., "The Physics of Macropore Formation in Low Doped n-Type Silicon", J. Electrochem. Soc., Oct. 1993, 140(10), 2836-2843.

National Phase Application No. EP 02779038: Supplementary European Search Report dated Apr. 29, 2010, 2 pages.

Search Report for Patent Application 091135225, Dated Sep. 25, 2008, 2 pages.

Soclof et al., "Improved Slicing Method for Silicon", Final Report Applied Solar Energy Corp., City of Industry, CA, Sep. 1981, 47 pages.

Soclof et al., "Wafering Insight Provided by the Ode Method", JPL Proc. Of the Low-Cost Solar Array Wafering Workshop, Feb. 1982, 259-266.

Stocks et al., "Texturing of Polycrystalline Silicon", Solar Energy Materials and Solar Cells, Mar. 1996, 40(1), 33-42.

Thorp et al., "Ray-tracing of arbitrary surface textures for light-trapping in thin silicon solar cells", Solar Energy Materials ad Solar Cells, Elsevier Science Publishers, Amsterdam NL, Nov. 1997, 48(1-4), 295-301.

Tuttle et al., "Progress Towards Commercialization of a 4.5-Sun, Flat-Plate concentrating PV Module and System", IEEE, 28th Photovoltaic Specialists Conference, Anchorage, AK, Sep. 15-22, 2000, 1468-1471.

Uematsu et al., "Design and Characterization of Flat-Plate Static-Concentrator Photovoltaic Modules", Solar Energy Materials & Solar Cells, Mar. 2001, 67(1-4), 441-448.

Uematsu et al., "Fabrication and Characterization of a Flat-Plate Static-Concentrator Photovoltaic Module", Solar Energy Materials & Solar Cells, Mar. 2001, 67(1-4), 425-434.

Uematsu et al., "Static Concentrator Photovoltaic Module with Prism Array", Solar Energy Materials & Solar Cells, Mar. 2001, 67(1-4), 415-423.

Xiao (Ed.), "Introduction to Semiconductor Manufacturing Technology", Prentice Hall, Inc., 2001, 129-133.

* cited by examiner

SEMICONDUCTOR DEVICE

CROSS-REFERENCE TO RELATED APPLICATIONS

This application is a continuation of U.S. application Ser. No. 10/432,936, filed Dec. 22, 2003, which is a 371 U.S. National Phase application claiming priority to PCT/AU01/01546, filed Nov. 29, 2001, which is based on Australian provisional application PR 1748, filed Nov. 29, 2000, the contents of which are incorporated herein by reference. This application is related to U.S. application Ser. No. 11/193,183, filed Jul. 29, 2005, now issued as U.S. Pat. No. 7,595,543, the contents of which are incorporated herein by reference.

TECHNICAL FIELD

The present invention relates to semiconductor processing, and in particular to methods for processing a semiconductor wafer to increase the useable planar surface area, to a method for fabricating solar cells and to a process for decreasing the reflectivity of a semiconductor surface.

BACKGROUND

In most areas of semiconductor processing, the cost of the starting substrate wafer is small compared to the value of the final, processed wafer. However, this is not always the case. For example, the photovoltaic solar cell industry is extremely cost sensitive, and the cost of a starting silicon wafer is typically nearly half of the processed wafer value. Thus, in this industry it is extremely important that the silicon substrates are used as efficiently as possible. These substrates are produced by sawing thin slices from a cylindrical boule of crystalline silicon, typically 6 inches (about 15 cm) in diameter. The thinnest slice that can be cut is determined by the mechanical properties of the silicon, and is typically 300-400 µm for the current generation of 6 inch wafers, but is projected to be 200 µm for the next wafer generation. However, the kerf loss for sawing through a 6 inch wafer is approximately 250 µm, meaning that much of the boule ends up as powder. There is a need, therefore, for a method which increases the useful surface area of semiconductor for a given unit volume of the semiconductor, or at least for a useful alternative to current methods of semiconductor processing.

SUMMARY

In accordance with a first embodiment of the present invention, there is provided a method for increasing the usable surface area of a semiconductor wafer having a substantially planar surface and a thickness dimension at right angles to said substantially planar surface, said method including the steps of selecting a strip thickness for division of the wafer into a plurality of strips, selecting a technique for cutting the wafer into said strips at an angle to said substantially planar surface, in which the combined strip thickness and width of wafer removed by the cutting is less than the thickness of the wafer, cutting the wafer into strips using the selected technique and separating the strips from each other.

In a second embodiment, the present invention provides a method for processing a semiconductor wafer having a substantially planar surface to increase the useable planar surface area of said wafer, including the steps of:

creating a plurality of parallel elongated slots at least partly through said wafer, such that the combined width of said slots and width between said slots is less than the thickness of said wafer, to create a series of semiconductor strips;

separating said strips from each other; and orienting said strips so that their faces which were previously at an angle to said substantially planar surface are exposed to form new planar surfaces.

It will be understood that the faces of the strips which were previously at an angle to the surface of the wafer are the faces of the strips exposed as a result of cutting the wafer and separating the strips from each other.

The semiconductor wafer is typically single crystal silicon or multicrystalline silicon. However, the semiconductor wafer may be a wafer of other semiconductor material capable of being fabricated into a thin, substantially flat wafer.

In a third embodiment, the present invention provides a method for producing silicon solar cells, said method comprising the steps of:

forming a plurality of parallel slots into a silicon substrate, said slots extending at least partly through said substrate to create a series of silicon strips;

separating said strips from each other; and fabricating solar cells from said strips.

Solar cells can be formed before or after the separation of the strips or as part of the separation process.

In the methods of the first to third embodiments of the invention the strips may be at any angle to the surface of the semiconductor wafer or substrate, such as at an angle of from 5° to 90° to the surface of the wafer or substrate. Typically the strips are at an angle of at least 30°, more typically at least 45°, still more typically at least 60° and even more typically about 90° (that is, substantially perpendicular) to the surface of the wafer or substrate.

Thus, in a preferred form of the method of the first embodiment of the invention, there is provided a method for processing a semiconductor wafer to increase the useable planar surface area, including the steps of selecting a strip thickness for division of the wafer into a series of thin strips generally perpendicular to the wafer surface, selecting a technique for cutting the wafer into said thin strips in which the combined strip thickness and width of wafer removed by the cutting is less than the thickness of the wafer, and dividing the wafer into said thin strips.

In a preferred form of the method of the second embodiment of the invention, there is provided a method for processing a semiconductor wafer to increase the useable planar surface area, including the steps of:

creating a series of parallel elongated slots through or nearly through said wafer, such that the combined width of said slots and width between said slots is less than the depth of said slots, to create a series of semiconductor strips;

separating said strips from each other; and orienting said strips so that their faces which were previously perpendicular to the original wafer surface are exposed to form new planar surfaces.

In one form of the methods of the first to third embodiments of the invention, a laser is used to form the slots in the wafer. An area around the periphery of the wafer may be left uncut, forming a frame, so that all the resulting strips are held within the frame. This allows handling of the wafer following formation of the slots, while the strips undergo further processing. The strips may be separated from the frame at any convenient stage of the further processing.

In another form of the methods of the first to third embodiments of the invention, a dicing saw is used to form the slots in the wafer. An area around the periphery of the wafer may be left uncut, forming a frame, so that all the resulting strips are held within the frame. This allows handling of the wafer following formation of the slots, while the strips undergo further processing. The strips may be separated from the frame at any convenient stage of the further processing.

In yet another form of the methods of the first to third embodiments of the invention, wet anisotropic etching of (110) oriented wafers is used to form the slots. An area around the periphery of the wafer may be left unetched, forming a frame, so that all the resulting strips are held within the frame. This allows handling of the wafer following formation of the slots, while the strips undergo further processing. The strips may be separated from the frame at any convenient stage of the further processing.

In still another form of the methods of the first to third embodiments of the invention, photo-electrochemical etching may be used to create an aligned series of perforations through a semiconductor wafer, and chemical etching may then be used to etch through the semiconductor remaining between the perforations and along the lines defined by the perforations, to form a narrow slot through the wafer.

In a further form of the methods of the first to third embodiments of the invention, at least one interconnecting portion is formed in or on the wafer, which connects adjoining strips to each other to maintain a relatively constant gap between the strips. Usually, in this form of the methods of the invention, there are a plurality of interconnecting strips. Conveniently, the interconnecting strips are spaced apart at regular intervals along the length of the strips. The inclusion of such interconnecting portions allows processing steps such as diffusions and oxidations to be carried out in a reliable and repeatable manner, resulting in predictable diffusion profiles and oxide thicknesses down the sides of the slots. The interconnecting portions suitably take the form of one or more strips of the semiconductor material formed at least partly across one or both main surfaces thereof, perpendicular or oblique to, and usually substantially perpendicular to, the strips which are defined by the plurality of slots.

The methods described herein are equally applicable to entire semiconductor wafers and to pieces of wafers. Consequently, the word wafer used in this specification is to be taken to refer to entire wafers or portions thereof.

In the methods of the second and third embodiments of the invention the slots are typically created through the complete thickness of the wafer, though not necessarily. Where the slots are created through the thickness of the wafer, they may be created in one step or more than one step. For example, the plurality of slots may be created partly through the wafer, optionally further processing may be carried out, such as doping of the surfaces of the strips so created, and then the plurality of slots may be completed by cutting or etching through the remainder of the thickness of the wafer. Thus, the step of separating the strips from each other will typically occur when the creation of the slots is completed through the entire thickness of the wafer. Alternatively, if a frame is left uncut around the periphery of the wafer as described above, the step of separating the strips from each other will occur when the strips are cut from the frame. As a further possibility, when interconnecting portions are employed to connect adjoining strips, as described above, the step of separating the strips from each other occurs when the interconnecting portions are removed or broken. As a still further possibility (though less preferred) the strips may be separated from each other by breaking them apart if the slots between the strips are formed only partway though the wafer but the remaining part of the wafer at the bottom of the slots is very thin.

Preferably, most of the processing of the strips into solar cells is carried out while the strips are supported within a frame formed from an uncut area around the periphery of the wafer. Following processing, the strips are cut out of the frame and laid flat side by side. Preferably, separation of the strips from the frame is carried out using a laser or dicing saw.

Advantageously, solar cells made by a process which includes a method in accordance with the present invention may be arranged with gaps between adjacent cells and used with an optical concentrator to increase the effective solar cell area.

Advantageously, said solar cells may be used with optical reflectors in order to utilise the cells fabricated by illumination on both sides of each solar cell strip.

In some forms of the methods of the invention, such as when chemical etching is used to form the slots that separate the strips, the newly-exposed surface of the semiconductor material is a polished surface. Such a surface is typically a reflective surface, and it will be appreciated that a reflective surface is undesirable for a solar cell. Although some techniques exist for texturing a polished semiconductor surface, they are not well adapted to be used in conjunction with the methods of the first to third embodiments of the present invention. Accordingly, there is a need for an improved process for reducing the reflectivity of a semiconductor surface.

The present invention, in another aspect, provides such a process.

Thus, in accordance with a fourth embodiment of the present invention, there is provided a process for decreasing the reflectivity of a surface of a semiconductor material, the process comprising:

applying a layer of a protective substance on said surface, said layer having a plurality of apertures therethrough;

contacting said layer and said semiconductor material with an etchant capable of etching said semiconductor material faster than said protective substance, said etchant making contact with said semiconductor material at least through said apertures, for a time and under conditions in which said semiconductor material is etched by said etchant in the vicinity of said apertures, but said protective substance is substantially unetched.

In the process of this embodiment, by "substantially unetched" is meant that the etching is carried out under conditions in which the semiconductor material is etched in the vicinity of the apertures in the protective substance, but sufficient of the protective substance remains on the surface of the semiconductor material at the end of the etching to prevent the semiconductor material from being etched in regions other than in the vicinity of the apertures.

In the process of the fourth embodiment, the semiconductor material is typically silicon and the protective substance is silicon nitride and the etchant is a mixture of hydrofluoric acid and nitric acid, such as a 1:50 by volume mixture of 49% by weight aqueous HF and 70% by weight aqueous nitric acid. When the semiconductor material is silicon, it may be single crystal silicon, microcrystalline silicon, multicrystalline silicon or polycrystalline silicon.

The process of the fourth embodiment typically includes the further step of removing the protective substance from the surface after the etching step has proceeded sufficiently to produce a plurality of etch pits on the surface. The protective substance may be removed by applying an etchant that etches the protective substance much more rapidly than the semiconductor material. For example, when the semiconductor material is silicon and the protective substance is silicon nitride, the protective substance may be removed by reactive ion etching or by contact with phosphoric acid at elevated temperature, typically about 180° C.

The layer of protective substance is typically only a few atomic layers thick and may be formed by known techniques such as chemical vapour deposition or low pressure chemical vapour deposition. Other possible techniques for applying the protective substance include spray pyrolysis, evaporation and sputtering. Thus, the layer of protective substance is typically about 2 nm thick, and when formed by low pressure chemical vapour deposition in this thickness is an incomplete layer in that it contains numerous holes though which the semiconductor material beneath the protective layer can be etched. When the semiconductor material is silicon and the layer of protective substance is a layer of silicon nitride about 2 nm thick, the step of etching the semiconductor is achieved by contacting with a 1:50 (v/v) HF/nitric acid mixture as described above for a time of a few minutes, typically 2-3 minutes, at ordinary room temperatures.

BRIEF DESCRIPTION OF THE DRAWINGS

Preferred embodiments of the present invention are hereinafter described, by way of example only, with reference to the accompanying drawings, which are briefly described as follows.

DETAILED DESCRIPTION OF ILLUSTRATIVE EMBODIMENTS

Figure 1:
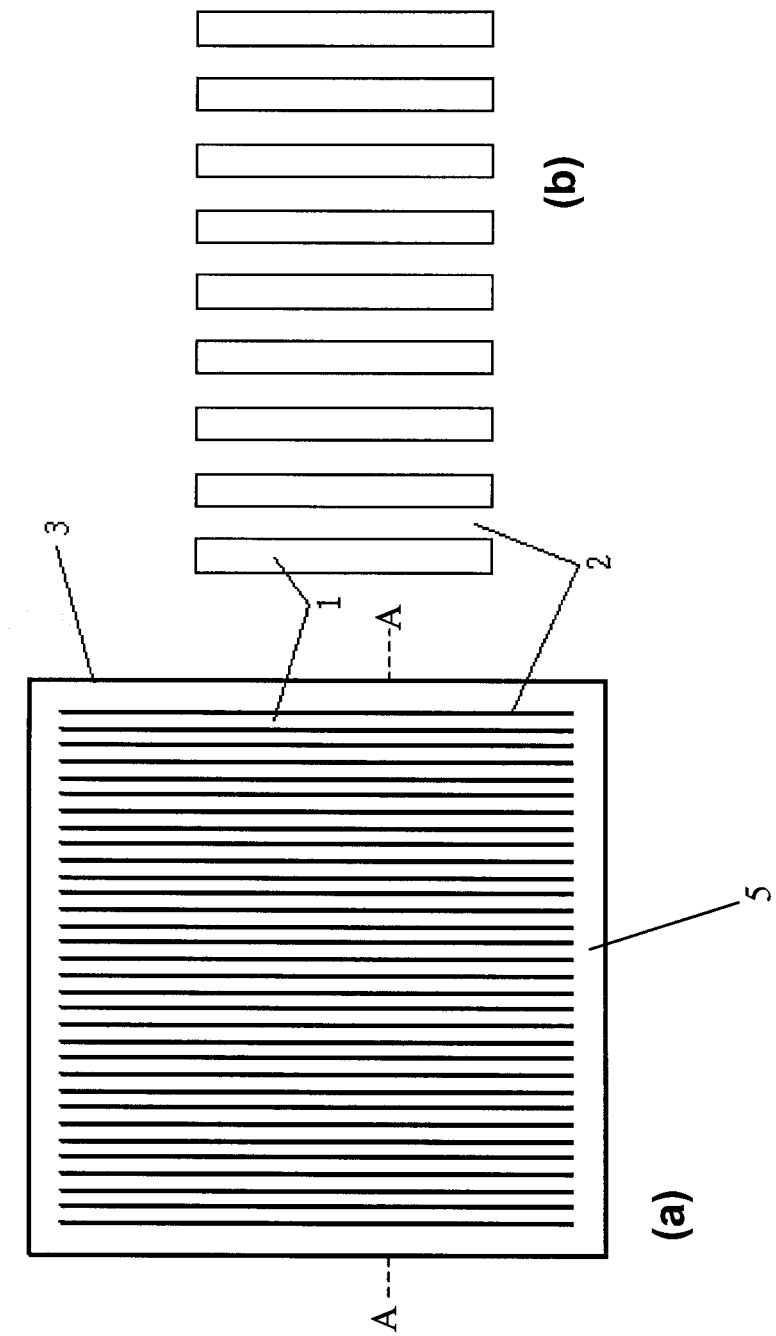
FIG. 1 is a schematic diagram showing top (FIG. 1(a)) and cross sectional (FIG. 1(b)) views of a silicon wafer following the formation of slots according to a preferred embodiment.

In the description of the drawings which follows, like items are referred to by reference to like numerals. It will be appreciated that the drawings are not to scale and are diagrammatic only. For example, for greater clarity, the drawings do not necessarily depict all of the slots, strips, interconnecting portions and the like formed in a semiconductor material by the methods described.

Referring to FIG. 1(a), a silicon wafer 3, at least 0.5 mm thick and typically about 1 mm thick, is formed by standard crystal growth and wafering techniques. Wafer 3 is preferably single-crystal, although multi-crystalline wafers may also be used. A series of parallel channels or slots 2 is formed in wafer 3, with the slots being typically 0.05 mm wide and the pitch of the slots being typically 0.1 mm, forming thin parallel strips of silicon 1, about 0.05 mm wide. Because slots 2 do not extend all the way to the edges of wafer 3, a frame 5 of uncut silicon holds strips 1 in place. Frame 5 is typically 5 mm wide on each side.

Slots 2 can be formed by cutting the wafer with a dicing saw having a narrow blade. Alternatively, slots 2 can be formed by laser ablation. For example, a Resonetics Nd:YLF Q-switched laser operating at the fundamental wavelength of 1046 nm or frequency doubled (523 nm) can be used to cut wafer 3. Other systems can also be used, such as a water-jet guided laser cutting system as described in U.S. Pat. No. 5,773,791. As a further possibility, slots 2 can be formed by using a wet anisotropic etchant, such as potassium hydroxide solution (KOH), as is well known in the art. In this case, it is necessary to use a single-crystal silicon wafer of (110) orientation. First, a suitable etch mask such as silicon dioxide or silicon nitride is deposited or grown on both sides of wafer 3. Photolithography is used to open narrow stripes in the etch mask on one surface of wafer 3, the stripes being typically 0.005 mm wide, at a 0.1 mm pitch and oriented along the [1-1-2] direction. Wafer 3 is now immersed in the etching solution. One suitable solution is an aqueous solution of 44% w/v KOH, with etching done at or above room temperature.

Any of the methods described above can be carried out either from one side of wafer 3 only, or from both sides of wafer 3, allowing thicker wafers to be used. For example, when using a laser capable of ablating 0.5 mm of silicon, a first set of slots is made from the front side of a 1 mm thick wafer. The wafer is then turned around, and a second set of slots, aligned to the first, is made. Alternatively, both sets of slots may be formed simultaneously by having aligned laser beams above and below the sample.

If either a dicing saw or a laser is used to form the slots, it is desirable to have multiple blades or multiple beams cutting slots into the substrate simultaneously in order to speed up the process. For example, if slots are to be formed over a 10×10 cm$^2$ wafer of silicon with a pitch of 0.1 mm, one thousand cuts are required. If twenty laser beams are arranged to hit the sample surface at a pitch of 5 mm, each beam is required to make only fifty cuts.

In FIG. 1(*b*) there is shown an enlarged vertical cross-section through the wafer 3 along line A-A showing strips 1 and spaces 2 in cross-sectional view.

Figure 2:
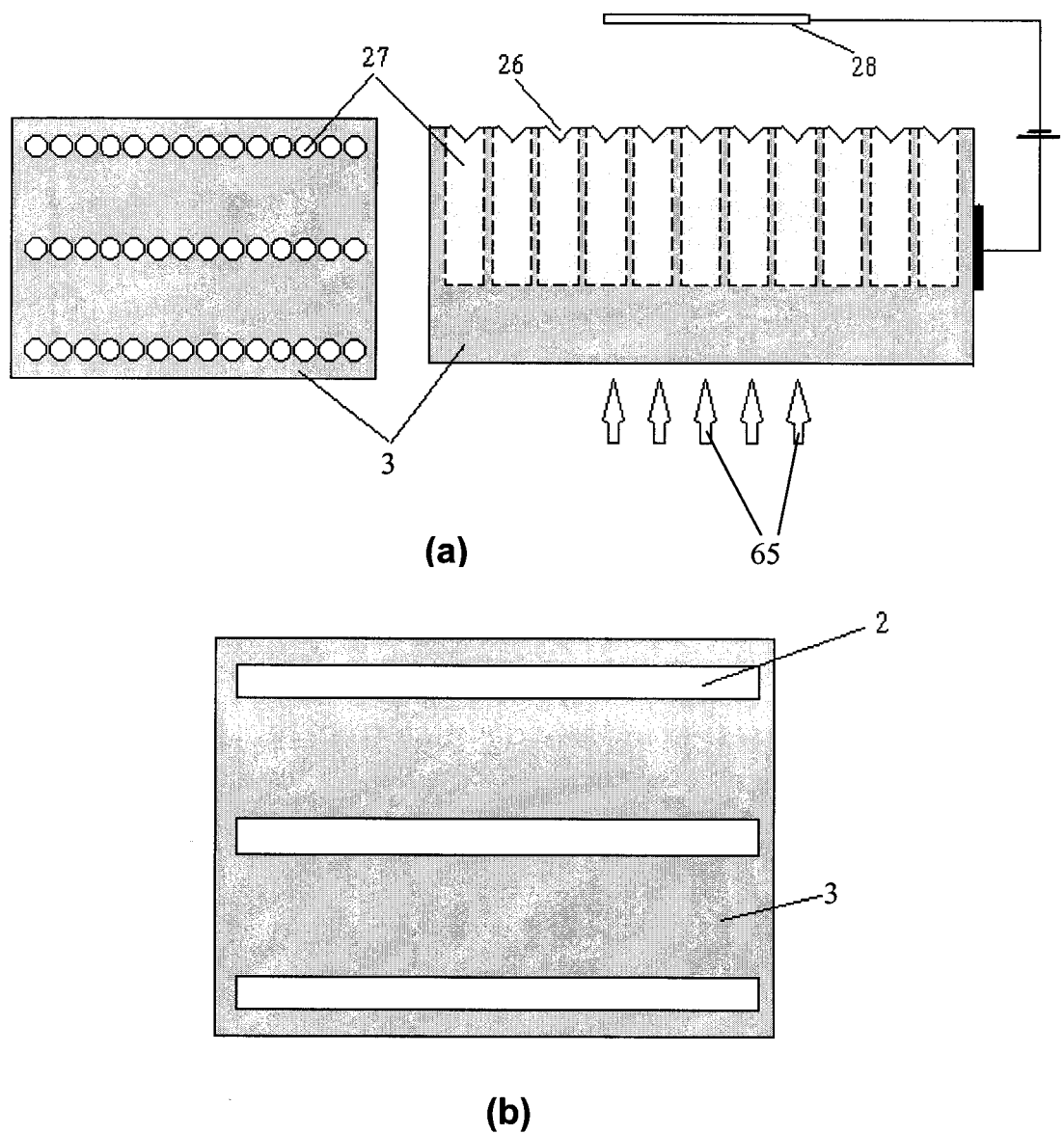
FIG. 2(a) shows a top view and a cross sectional view of a silicon wafer in which macropores are formed according to a further embodiment of the invention.
FIG. 2(b) shows a top view of the silicon wafer illustrated in FIG. 2(a) after grooves have been formed by joining the macropores.

FIGS. 2(*a*) and 2(*b*) illustrate a further method of forming slots in the substrate by use of photo-electrochemical etching. Photo-electrochemical etching is described by Lehmann (*Journal of the Electrochemical Society*, Vol. 140, No. 10, (1993) p. 2836). As shown in FIG. 2(*a*), an n type silicon wafer 3 of (100) orientation is used. Wafer 3 is provided with an array of indents 26 by lithography and KOH etching. Indents 26 are arranged along rows, with the spacing between indents 26 being typically 5-10 microns, while the spacing between rows of indents 26 is typically 50 microns. Wafer 3 is then immersed in a suitable etch, such as a 10% solution of hydrofluoric acid. Illumination 65 is directed onto the rear of wafer 3 and a positive bias voltage is applied to wafer 3. A counterelectrode 28 is placed in the solution in the vicinity of the wafer. Under these conditions, an array of macropores 27 is formed which extends into silicon wafer 3. Etching is continued until macropores 27 extend all the way through wafer 3.

Silicon wafer 3, provided with an array of macropores 27, is then immersed in a silicon etchant such as a potassium hydroxide solution. This results in an enlargement of macropores 27. As shown in FIG. 2(*b*), with continued etching, macropores 27 coalesce to form slots 2 extending through wafer 3. This technique allows the creation of very narrow slots 2 of less than 10 microns in width.

Figure 3:
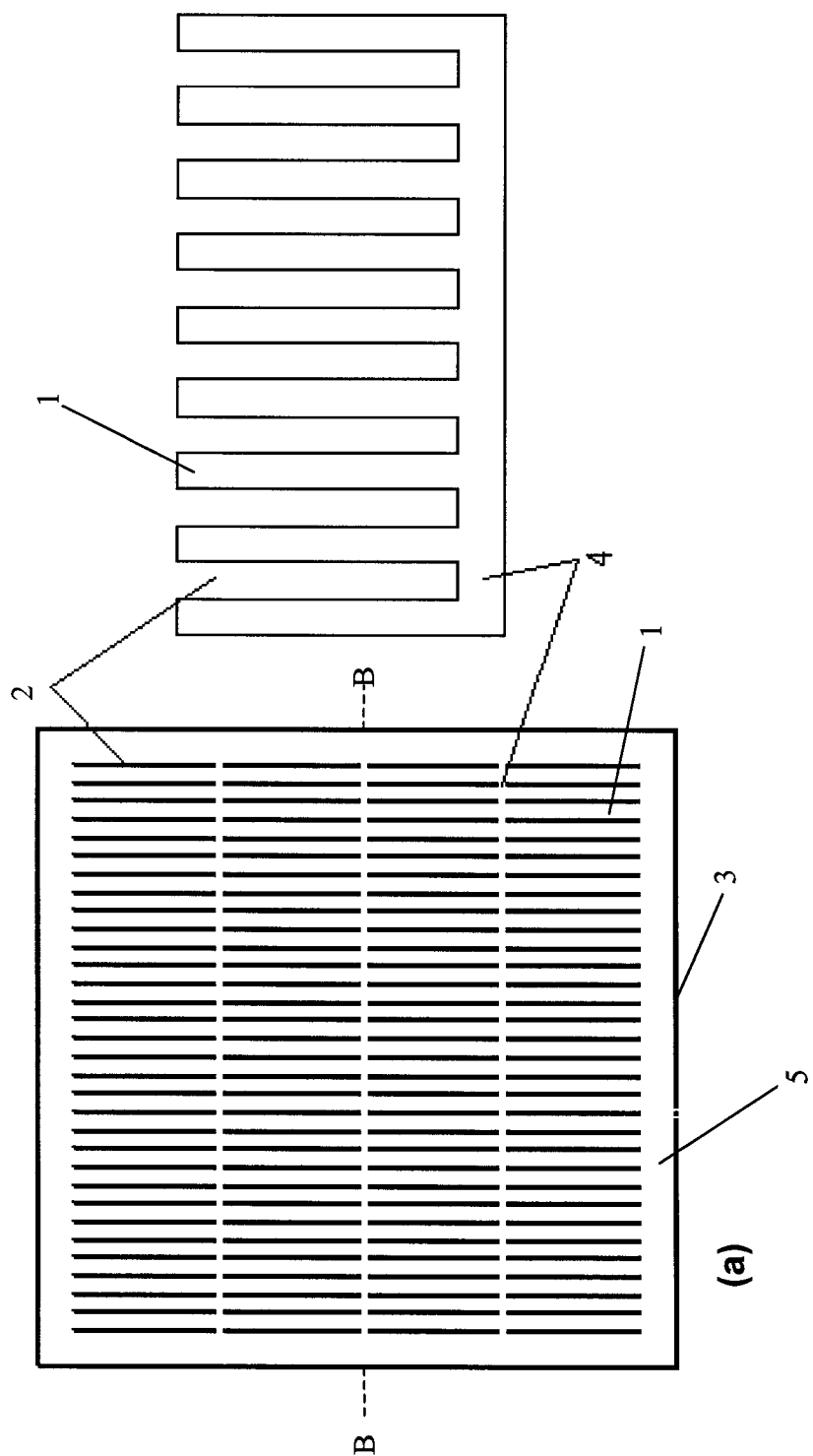
FIG. 3 is a schematic diagram showing bottom (FIG. 3(a)) and cross-sectional (FIG. 3(b)) views of a silicon wafer following the formation of slots and interconnecting strips according to a preferred embodiment.

In yet a further form of the methods of the first to third embodiments, slots through the wafer extend all the way through the wafer over most of their length but at regular intervals along the slots they are less deep so that some substrate remains at the bottom of the groove, forming a series of connecting strips. This is shown in FIGS. 3(*a*) and 3(*b*). FIG. 3(*a*) is a view from the underside of the wafer showing connecting strips 4 running across wafer 3 from opposite sides of frame 5, with slots 2 extending through wafer 3 over most of their length. FIG. 3(*b*) is a vertical cross-section through line B-B in FIG. 3(*a*). The structure shown in FIGS. 3(*a*) and 3(*b*) can be fabricated by laser ablation. Connecting strips 4 restrict the amount of bending of silicon strips 1 during further processing and thereby limit the variation in slot width. This ensures that the sidewalls of strips 1 can be reliably processed, as described below. Connecting strips 4 are typically 0.1 mm wide, 0.05 mm high and spaced 10 mm apart.

Figure 4:
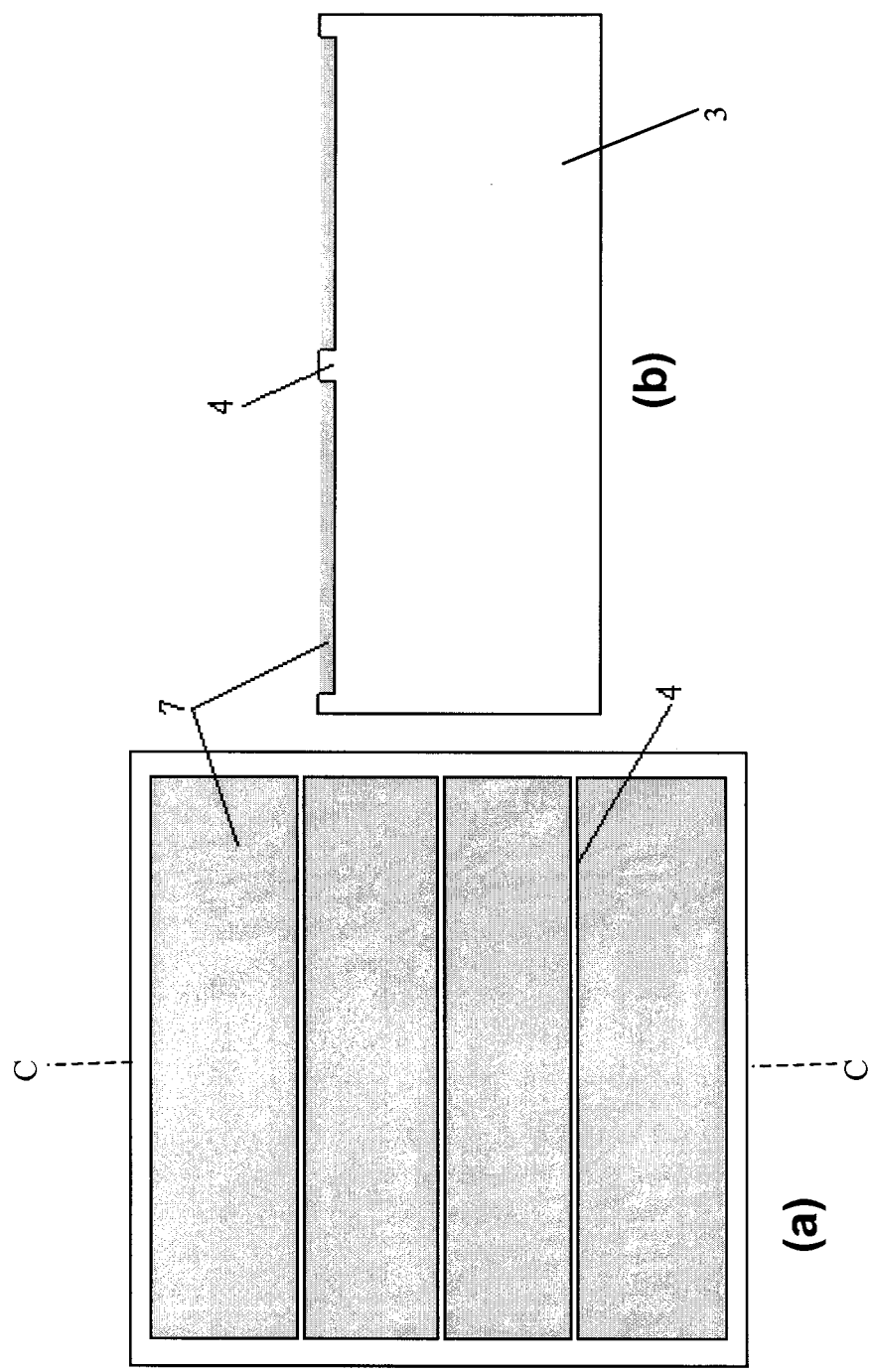
FIG. 4 is a schematic diagram showing top (FIG. 4(a)) and cross-sectional (FIG. 4(b)) views of a silicon wafer following the formation of shallow trenches according to a preferred embodiment.

In a still further form of the methods of the first to third embodiments, shown in FIGS. 4(*a*), 4(*b*) and 5, trenches 7 are created in a silicon wafer 3 using an appropriate technique such as wet chemical etching, plasma etching or mechanical grinding using a dicing saw tool with a wide blade. Trenches 7 are formed in such a way to result in a series of regularly spaced connecting strips 4. Trenches 7 are typically 0.05 mm deep and connecting strips 4 so formed are typically 0.1 mm wide and spaced 10 mm apart.

Figure 5:
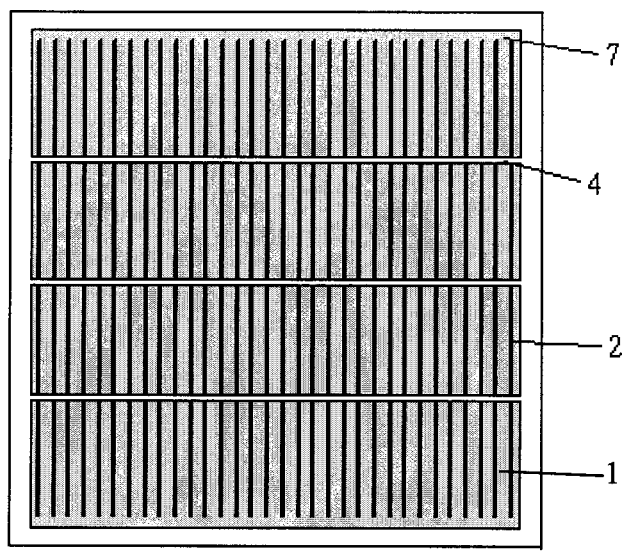
FIG. 5 is a schematic diagram showing a top view of the structure resulting from the formation of slots in the wafer shown in FIG. 4, in accordance with a preferred embodiment.

Slots 2 are then formed in wafer 3 from the face opposite to the face of wafer 3 in which trenches 7 are formed, using either a dicing saw or KOH etching, as shown in FIG. 5. Slots 2 extend all the way through wafer 3 in regions where trenches 7 were formed, but not all the way through in the regions of connecting strips 4. As in the method described above with reference to FIGS. 3(*a*) and 3(*b*), connecting strips 4 restrict the amount of bending of silicon strips 1 and restrict the variation in the width of slots 2 between silicon strips 1. It is also possible to reverse the order of the steps of slot and trench formation, by first forming slots which extend nearly all the way through the wafer, and then forming trenches on the other side of the wafer.

Figure 6:
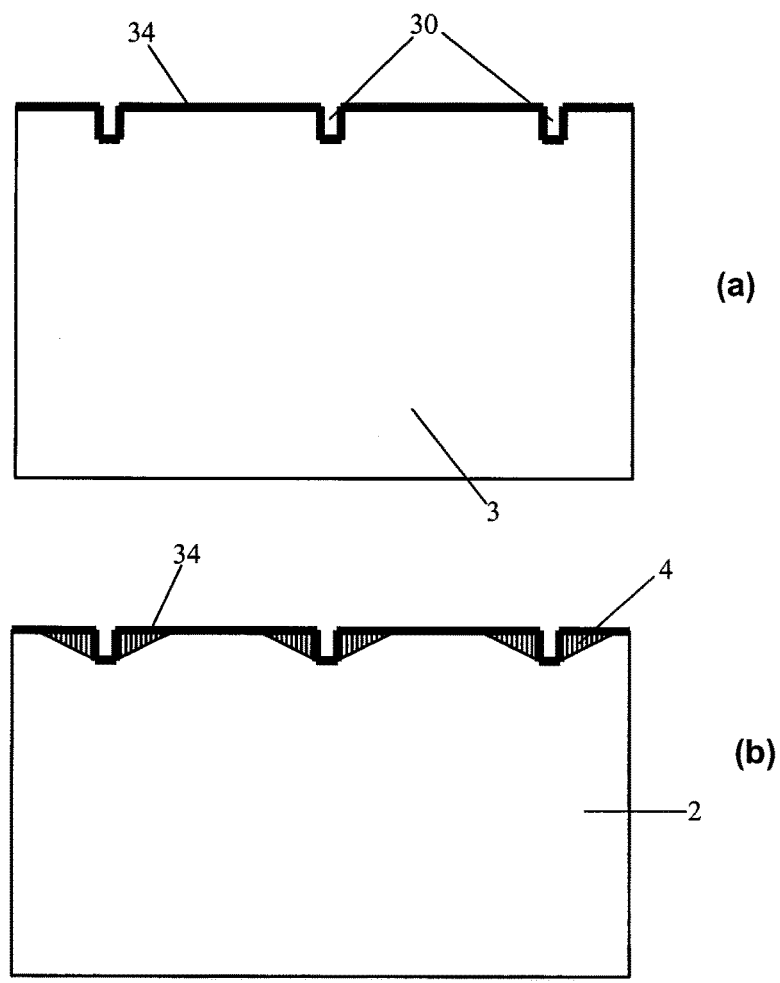
FIG. 6(a) is a schematic cross sectional view of a silicon wafer into which a plurality of shallow grooves has been formed.
FIG. 6(b) is a schematic cross sectional view of the same structure after etching, orthogonal of the cross-section shown in FIG. 6(a).

A still further form of a method in accordance with the present invention is illustrated in FIGS. 6(*a*), 6(*b*) and 7.

Figure 7:
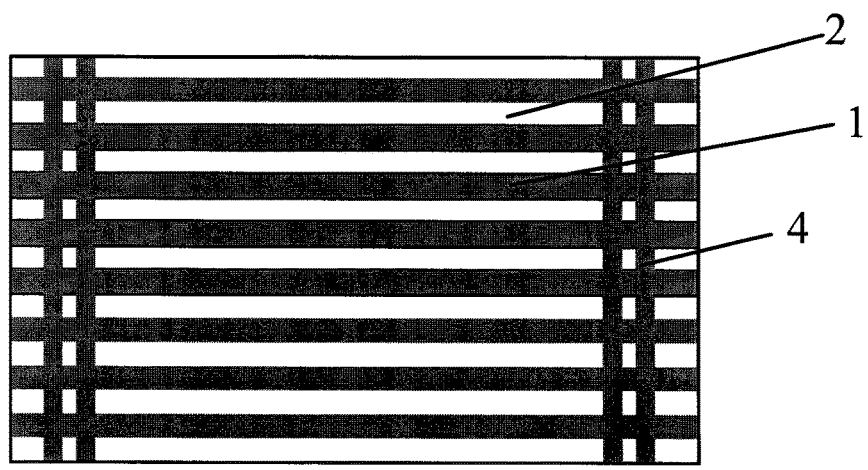
FIG. 7 is a top view of the structure illustrated in FIG. 6(b).

FIG. 6(*a*) shows a cross-sectional view of a silicon wafer 3 into which a series of shallow grooves 30 have been formed by a suitable technique, such as using a dicing saw or a laser. Grooves 30 are typically 20 microns deep, 50 microns wide and spaced 10 mm apart. A suitable etch mask 34 such as a stack of silicon dioxide and silicon nitride is then applied to the surface. Slots 2 are then etched into wafer 3 using photolithography and KOH etching as described previously. Slots 2 are etched from the face of wafer 3 opposite to the one containing grooves 30. Grooves 30 are perpendicular to slots 2. This will result in connecting strips 4 of silicon remaining behind at the completion of the etch process, as shown in FIG. 6(*b*), which is a cross-section through one of slots 2 perpendicular to the cross-section shown in FIG. 6(*a*). Connecting strips 4 limit the amount of bending of silicon strips 1 and thereby limit the variation in slot width. FIG. 6(*b*) shows a cross sectional view of the resulting structure after the completion of etching. FIG. 7 is a top view of the resulting structure when viewed from the side of wafer 3 containing grooves 30. It shows silicon strips 1 and slots 2 which have resulted from etching of wafer 3. At regularly spaced intervals there exist connecting strips 4 (only some are shown) which limit the amount of bending of silicon strips 1.

Figure 8:
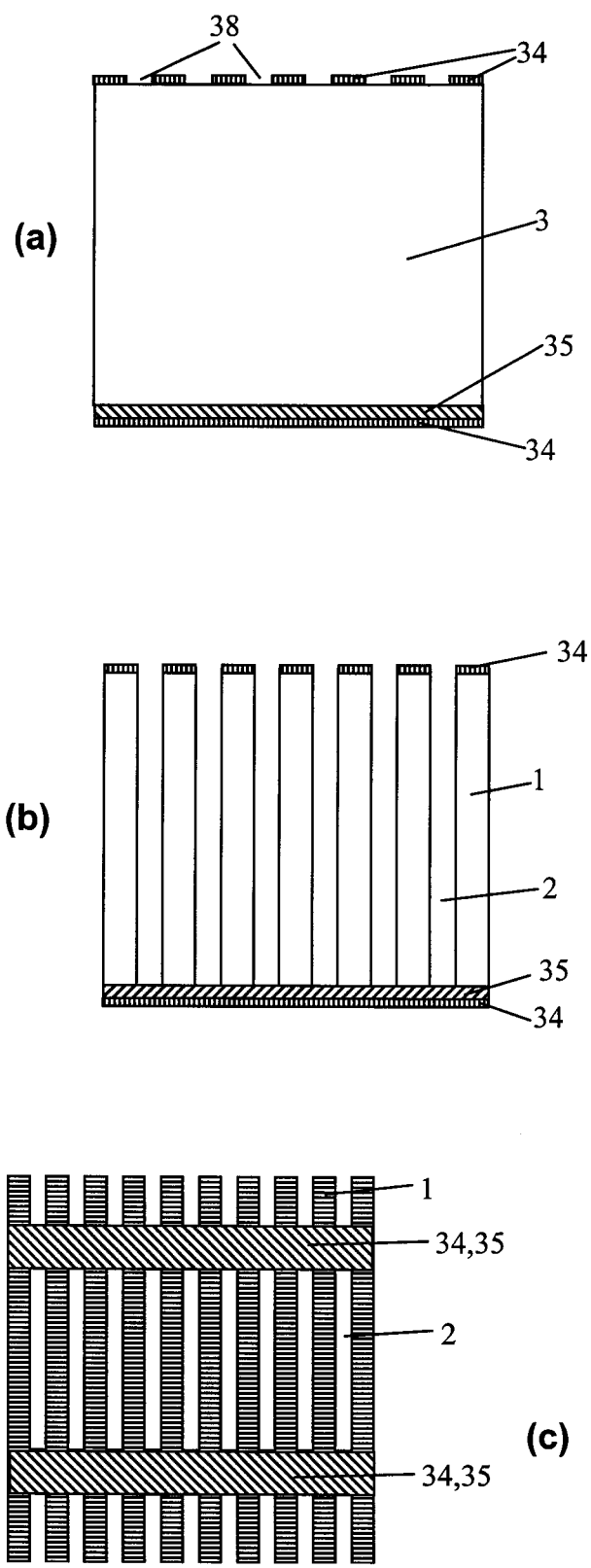
FIGS. 8(a) and 8(b) are schematic cross sectional views of a part of a (110) oriented silicon wafer before and after the formation of slots in the wafer.
FIG. 8(c) is a schematic top view of the structure shown in cross-section in FIG. 8(b).

Yet a further form of the methods of the first to third embodiments of the present invention is illustrated in FIGS. 8(*a*) to 8(*c*).

FIG. 8(*a*) shows a cross-sectional view of a part of a (110) oriented silicon wafer 3. An etch mask 34 has been applied to both surfaces of the wafer. Typically etch mask 34 consists of a stack of silicon dioxide and silicon nitride, with each layer typically 50-100 nm thick. Etch mask 34 has been patterned on the front side to create a series of narrow line openings 38 through which the silicon wafer substrate 3 is exposed. On the rear side, a thicker oxide 35, typically in the range 0.5-5 microns thick, had been formed prior to deposition of etch mask 34. Oxide layer 35 can be formed by various techniques, such as by thermal oxidation, chemical vapour deposition or by the application of a spin-on glass. The oxide is patterned to create a series of oxide strips (not shown), with the strips being oriented at right angles to the openings 38 in the etch mask 34 on the top surface.

FIG. 8(*b*) shows a cross-sectional view of the structure of FIG. 8(*a*) following etching in KOH. Slots 2 have been etched, creating a series of silicon strips 1. Slots 2 are etched from the top surface of wafer 3 through line openings 38 in top etch mask 34. Because oxide 35 under rear etch mask 34 was relatively thick and because oxide 35 is etched only very slowly by the KOH etch solution, oxide 35 remains behind at the end of the etch process, creating a series of connecting strips between silicon strips 1. The connecting strips limit the amount of bending of silicon strips 1 and thereby limit the variation in slot width.

FIG. 8(*c*) shows a top view of the structure shown in cross-section in FIG. 8(*b*), showing silicon strips 1 and slots 2. At regularly spaced intervals, etch mask 34 and oxide 35 below it create connecting strips which limit the amount of bending of silicon strips 1 and thereby limit the variation in slot width.

Figure 9:
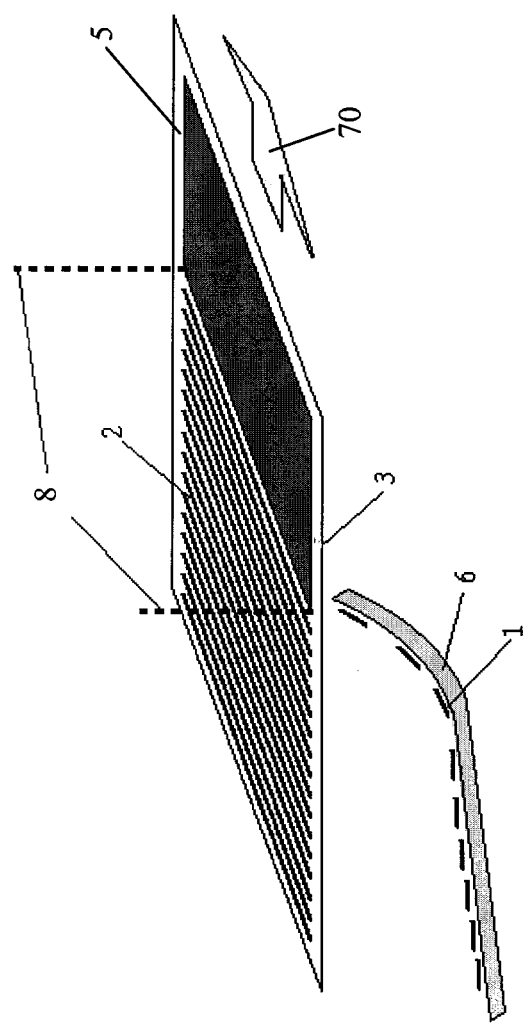
FIG. 9 is a schematic diagram illustrating a method for separating silicon strips from their frame by means of a laser, in accordance with a preferred embodiment.

Having formed structures as described above, the entire wafer may be processed to form solar cells, as described below. Following processing of the wafer and prior to separation of the silicon strips from the supporting frame, the connecting strips, if present, are removed if required. This can be done, for example, by laser ablation. Removal of the connecting strips may not be required if they are so thin that they will break when the silicon strips are separated from the supporting frame. The silicon strips are then separated from the supporting frame and laid flat by means of an arrangement such as that shown in FIG. 9. As seen in FIG. 9, wafer 3 is supported at frame 5 and moved along a direction 70 perpendicular to slots 2. Two stationary laser beams 8 ablate silicon at either end of silicon strips 1, thus separating them from frame 5. A catcher 6 underneath wafer 3 is positioned to catch separated strips 1 and move them down a slope and onto a suitable substrate. This arrangement ensures that strips 1 are laid flat, ready for further processing, with a minimal amount of handling.

Figure 10:
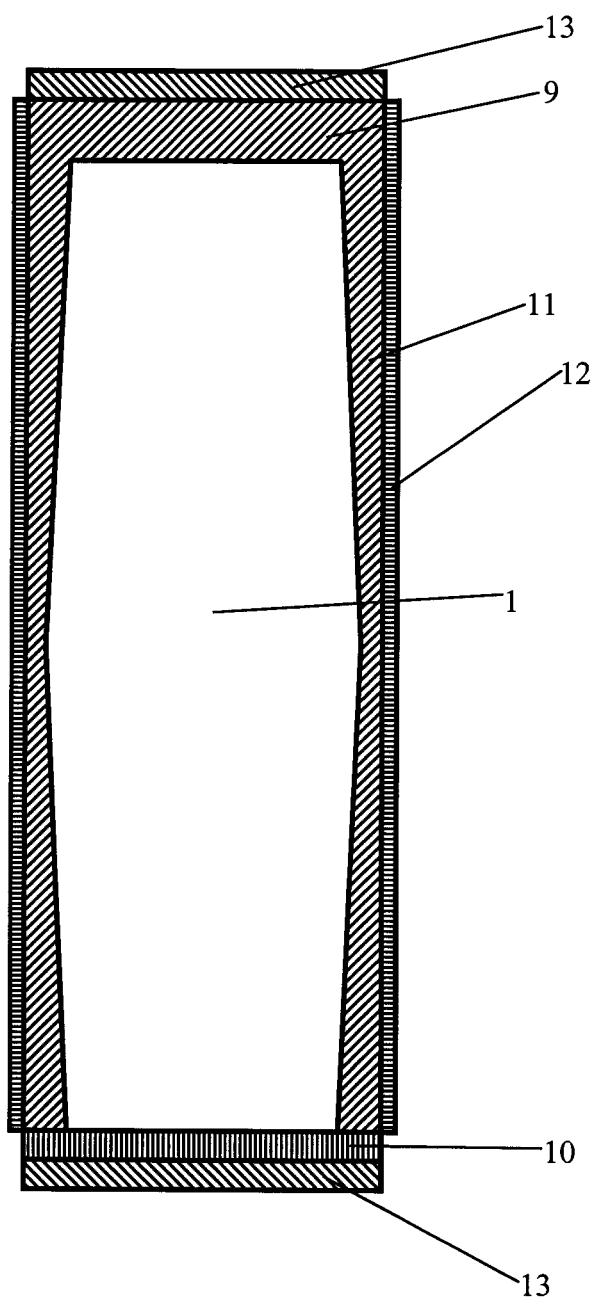
FIG. 10 is a schematic diagram showing a cross-sectional view of a silicon strip prepared in accordance with the present invention and fabricated into a solar cell.

Solar cells can be fabricated on the silicon strips 1 by the following process, which is described with reference to FIG. 10. FIG. 10 illustrates a strip 1 obtained as described generally above from a wafer, having a heavy boron diffusion layer 10 at one end thereof, heavy phosphorus diffusion layer 9 at the other end and light phosphorus diffusion layers 11 on its other two sides. The sides are coated with oxide layers 12. Metallic contacts 13 are deposited at each end of strip 1. Strip 1 may be fabricated as follows.

The starting wafer is p-type with a resistivity of around 1 ohm-cm. A heavy phosphorus diffusion 9 (typically 10 ohms per square) is made on one side of the wafer, followed by a heavy boron diffusion 10 (typically 20 ohms per square) into the opposite side. A thin oxide (around 50 nm) is grown on both sides of the wafer, followed by deposition of a thin layer (around 50 nm) of LPCVD silicon nitride resulting in a layer on each side of the wafer. Slots are subsequently formed in the wafer, as described above. If a dicing saw or laser is used, the slots are etched in a suitable solution such as 20% KOH at room temperature, in order to clean the sidewalls of the strips and remove any residual damage. The sidewalls can be textured using a suitable texturing technique. A light phosphorus diffusion 11 of around 200 ohm per square is made with both sides of the wafer exposed to the dopant, so that the sidewalls are entirely n-doped. This is followed by the growth of an oxide 12 of around 200 nm thickness on the exposed sidewalls. Next, the nitride layer is stripped off the front and rear of the wafer using either reactive ion etching or other suitable nitride etch such as hot phosphoric acid at about 180° C. The thin oxide underneath the nitride is then removed in hydrofluoric acid solution. Since oxide 12 covering the light phosphorus diffusion is much thicker than the oxide under the nitride, it is not removed by this etch. Metal 13 is now deposited on both sides of the wafer in such a way as to minimise deposition of the metal down the sidewalls. This can be done, for example, by line of sight vacuum evaporation.

Figure 11:
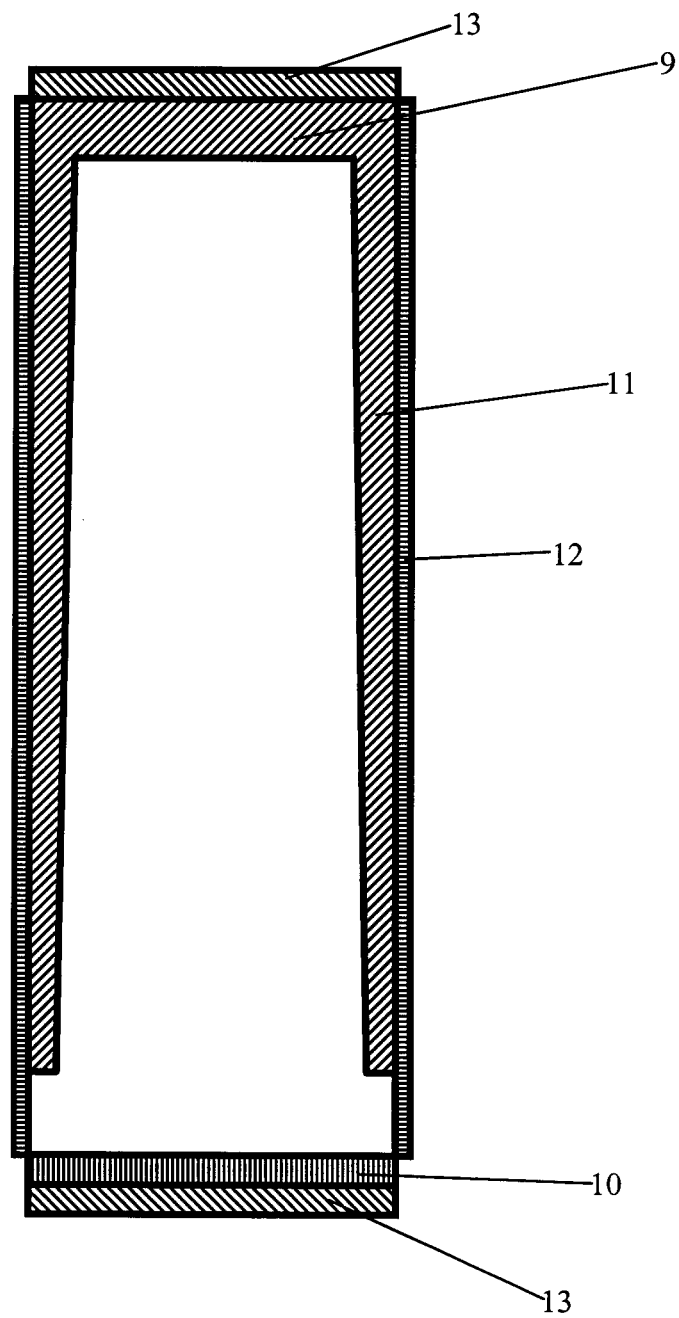
FIG. 11 is a schematic diagram showing a cross-sectional view of a silicon strip prepared in accordance with the present invention and fabricated into another solar cell.

In another process for fabricating solar cells, described with reference to FIG. 11, phosphorus 9 and boron 10 are diffused into the front and rear sides of a (110) oriented wafer, respectively, and layers of silicon dioxide and silicon nitride are deposited on both wafer surfaces, as described above. Using laser ablation or photolithography/etching, stripes running along the [1-1-2] direction are opened in the top oxide and nitride layers. The wafer is then placed in KOH solution until grooves are etched to within typically 50 microns of the rear surface. A light phosphorus diffusion 11 of typically 200 ohms per square is then made into the grooves, and an oxide 12 of typically 150 nm thickness is grown. Stripes aligned with the grooves are then opened in the oxide and nitride layers on the rear surface, as described above. The wafer is again immersed in KOH solution until the new grooves etched into the wafer from the rear join up with the grooves made from the front side to produce slots extending all the way through the wafer. A thin oxide 12 is then grown to passivate the sections of the sidewalls not already covered with oxide. The nitride and oxide layers on the front and rear surfaces are then stripped and metal contacts 13 are deposited on the front and rear surfaces. The resulting cell structure is shown in FIG. 11.

Figure 12:
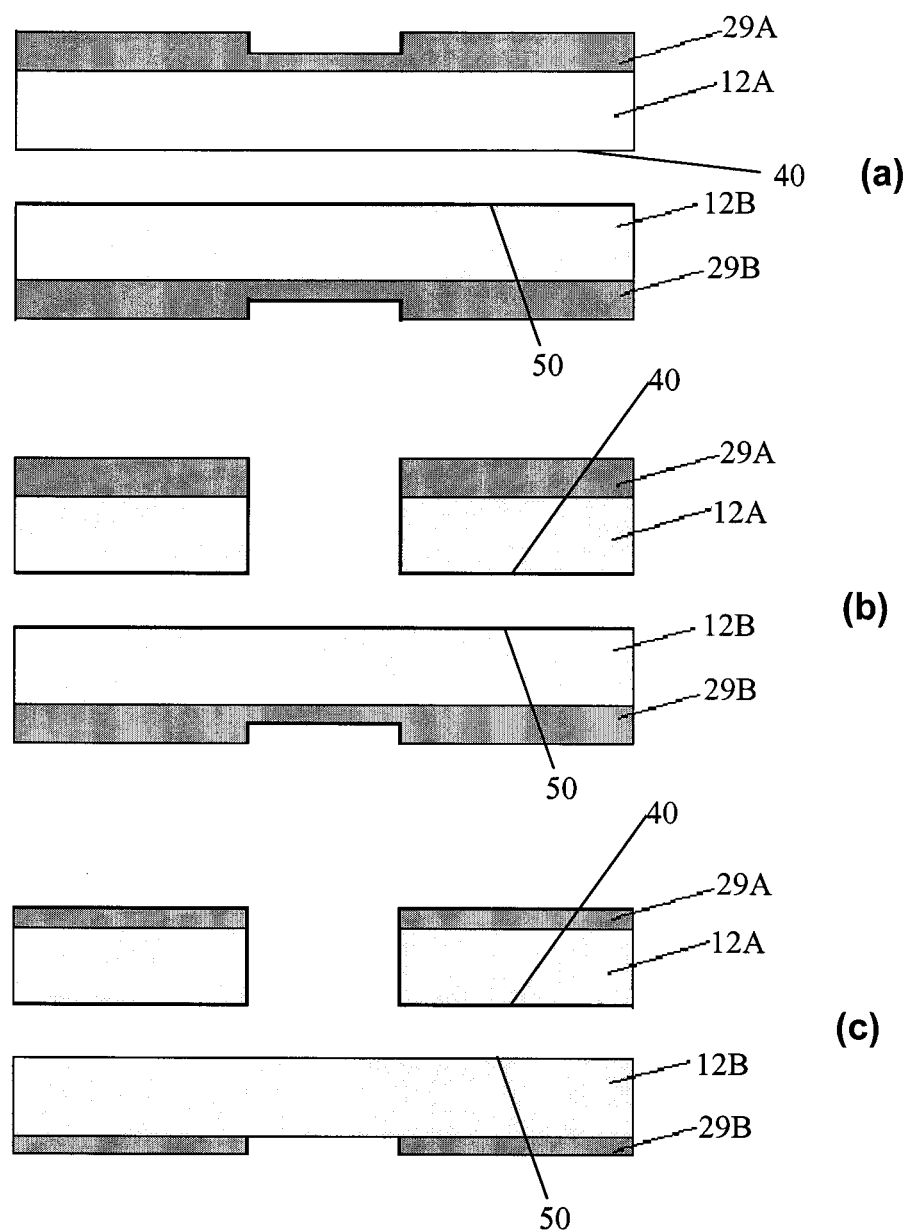
FIGS. 12(a), 12(b) and 12(c) are a series of schematic diagrams showing cross-sectional views of the front and rear surfaces of a silicon wafer during a strip formation process of a preferred embodiment.

This cell structure can be realised using just one photolithographic step, as follows. Following deposition of oxide and nitride on the front and rear surfaces, both surfaces are coated with photoresist and aligned stripe patterns are photolithographically defined in both resist layers. This may be achieved in a single exposure step by arranging for simultaneous exposure of two aligned masks, one above the wafer, and the other below the wafer. After developing the photoresist, the wafer is immersed in buffered HF solution, which etches silicon nitride as well as silicon dioxide, albeit more slowly. The wafer is removed from the etching solution when about half the thickness of the nitride layers has been etched, as shown in the schematic illustration of the oxide layers 12A and 12B, and nitride layers 29A and 29B, on front surface 40 and rear surface 50 respectively, in FIG. 12(*a*) (the photoresist layer is not shown). Rear surface 50 is then protected from further etching, for example by deposition of a further layer of photoresist. The wafer is again immersed in etching solution until the nitride 29A and oxide 12A layers in the stripes have been completely removed, as shown in FIG. 12(*b*), and KOH etching to form grooves into front surface 40 can be carried out. In order to form a mask of stripes on rear surface 50, the wafer is immersed in hot phosphoric acid to remove the remaining nitride in the partially etched trench, as shown in FIG. 12(*c*). The wafer is immersed in an HF solution to remove the oxide 12B remaining in the stripes on rear surface 50. This does not significantly affect the nitride layer because the nitride etch rate is much lower than the oxide etch rate. The wafer can then be immersed in KOH solution in order to etch grooves into the wafer from the rear surface 50 of the silicon wafer. As above, strips are formed after the front and rear silicon etch fronts meet.

Once the wafer has been processed and the strips have been separated from each other, the strips are laid flat on a suitable substrate. The cells can be connected in series or in parallel, either with a gap between cells in the case where static concentration of light is used, or without a gap between cells.

Figure 13:
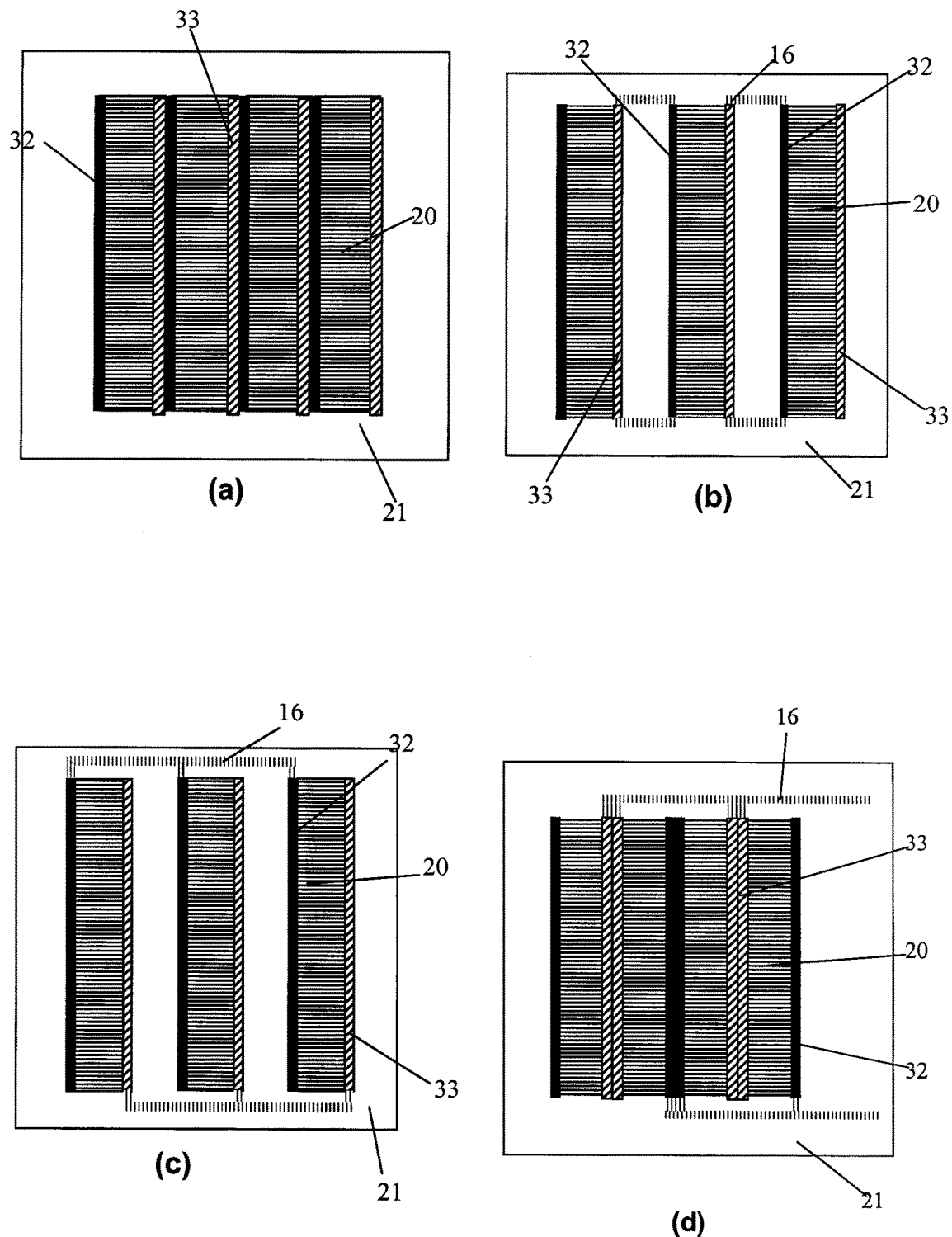
FIGS. 13(a) to 13(d) are schematic illustrations of various ways in which silicon strips prepared by the process of the present invention can be electrically interconnected.

FIG. 13(*a*) shows a way to create series connection without a gap between cells. Cells 20 are arranged on a substrate 21 so that the p polarity contact 32 of one cell is in close proximity to the n polarity contact 33 of the adjacent cell. Electrical connections are then made connecting the p polarity contact of one cell to the n polarity contact of the next cell.

FIG. 13(b) shows a way to create series connection with a gap between cells. Cells 20 are arranged on a substrate 21 as shown. Electrically conductive tracks 16 are formed so that the p polarity contact 32 of one cell is electrically connected to the n polarity 33 contact of the adjacent cell.

FIG. 13(c) shows a way to create parallel connection with a gap between cells. Cells 20 are arranged on a substrate 21 as shown. Electrically conductive tracks 16 are formed so that all the p polarity contacts 32 are electrically connected together at one end of the cells while all the n polarity contacts 33 are electrically connected together at the other end of the cells.

FIG. 13(d) shows a way to create parallel connection with no gap between cells. Cells 20 are arranged on a substrate 21 as shown. Every second cell has been oriented so that the order of its p contacts 32 and n contacts 33 is reversed. Electrically conductive tracks 16 are formed so that all the p polarity contacts are electrically connected together at one end of the cells while all the n polarity contacts are electrically connected together at the other end of the cells.

The arrangements of FIGS. 13(b)-(d) as well as many other possible arrangements require that electrically conductive tracks be formed on the substrate on which the cells are mounted. The tracks may be formed before or after the placement of the cells on the substrate. If the tracks are formed prior to the placement of the cells on the substrate, they can be formed using any of a number of well known techniques such as screen printing, metal evaporation or sputtering. One possible approach is to screen print solder paste onto the substrate to form the required tracks. The cells are then placed on the substrate and the substrate is heated to reflow the solder and create the electrical and physical contact to the cells. If the tracks are formed after the placement of the slivers, then the tracks and the electrical connection of the cells to the tracks may be formed at the same time. Any number of well known processes and materials may be used, including electrically conductive adhesive and electrically conductive ink.

After the individual cells have been fabricated and mounted according to any of the embodiments described above, the cells must be packaged into a suitable form for use.

Because each of the strips is an individual cell, this can be exploited to increase the effective area of each cell by using a light concentrator. In order to increase the amount of light absorbed by each cell, the cells are not placed next to each other but spaced apart by a certain distance. The spacing is between 0 and 3 times the width of each cell. Advantage can also be taken of the fact that the cells are bifacial: that is, they respond equally well to sunlight impinging on either surface.

Figure 14:
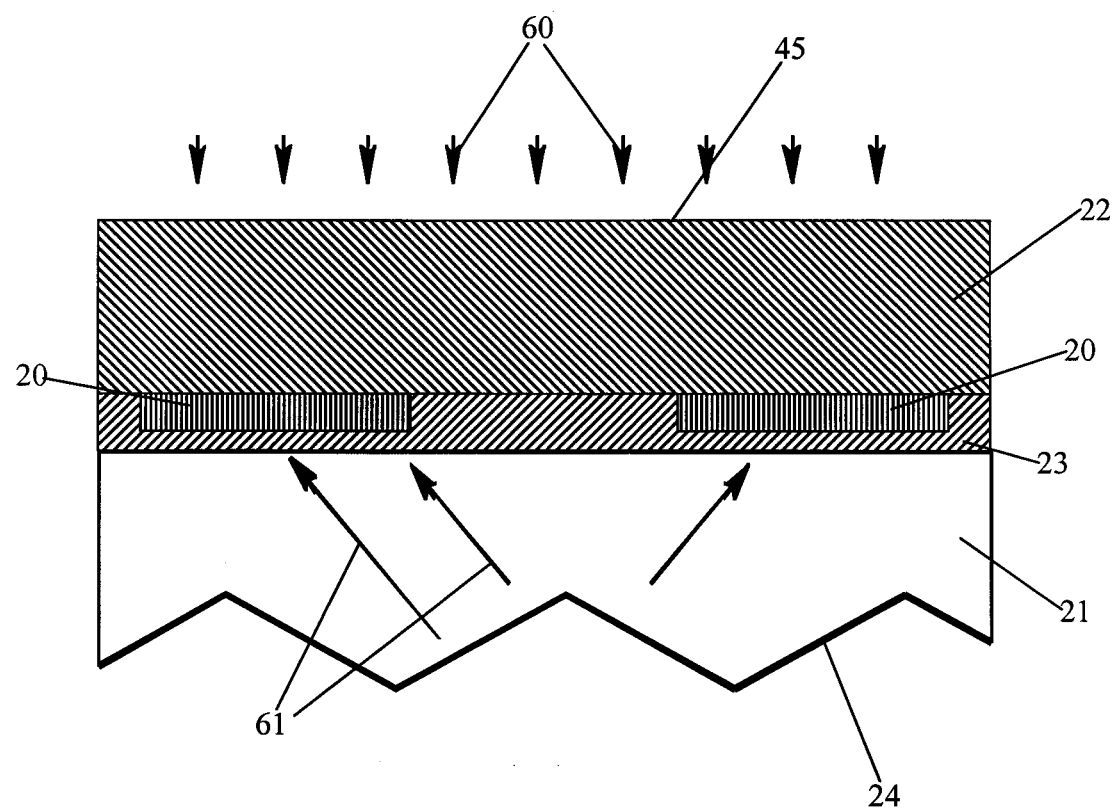
FIG. 14 is a schematic diagram showing a cross-sectional view of silicon strips mounted on a suitable substrate and positioned adjacent to a light concentrator to concentrate sunlight onto the strips.

FIG. 14 shows a cross sectional view of a possible concentrator structure. Cells 20 are mounted on a glass superstrate 22 using a suitable optical adhesive. Cells 20 have been electrically connected to each other by a suitable combination of series and parallel connections (not shown). A suitable transparent substrate 21, such as glass, has been applied and the space between cells 20 and substrate 21 has been filled with a suitable pottant 23, such as ethyl vinyl acetate (EVA) or a silicone. The rear surface of substrate 21 has a sawtooth shape and a reflector 24, made of a suitable reflective material such as silver, has been applied to it to form a rear reflector. The reflector structure is not aligned to cells 20 and need not have the same period as the spacing of cells 20. Preferably, the period of reflector 24 is much less than the spacing of cells 20. Sunlight 60 which passes through the space between cells 20 will be reflected off rear reflector 24 and the reflected light 61 will have a second chance at being absorbed by the cells. Further, light that reaches the front air-glass interface 45 may be reflected back into superstrate 22 if it strikes interface 45 at greater than the critical angle, thus giving it yet another chance at being absorbed by cells 20.

Figure 15:
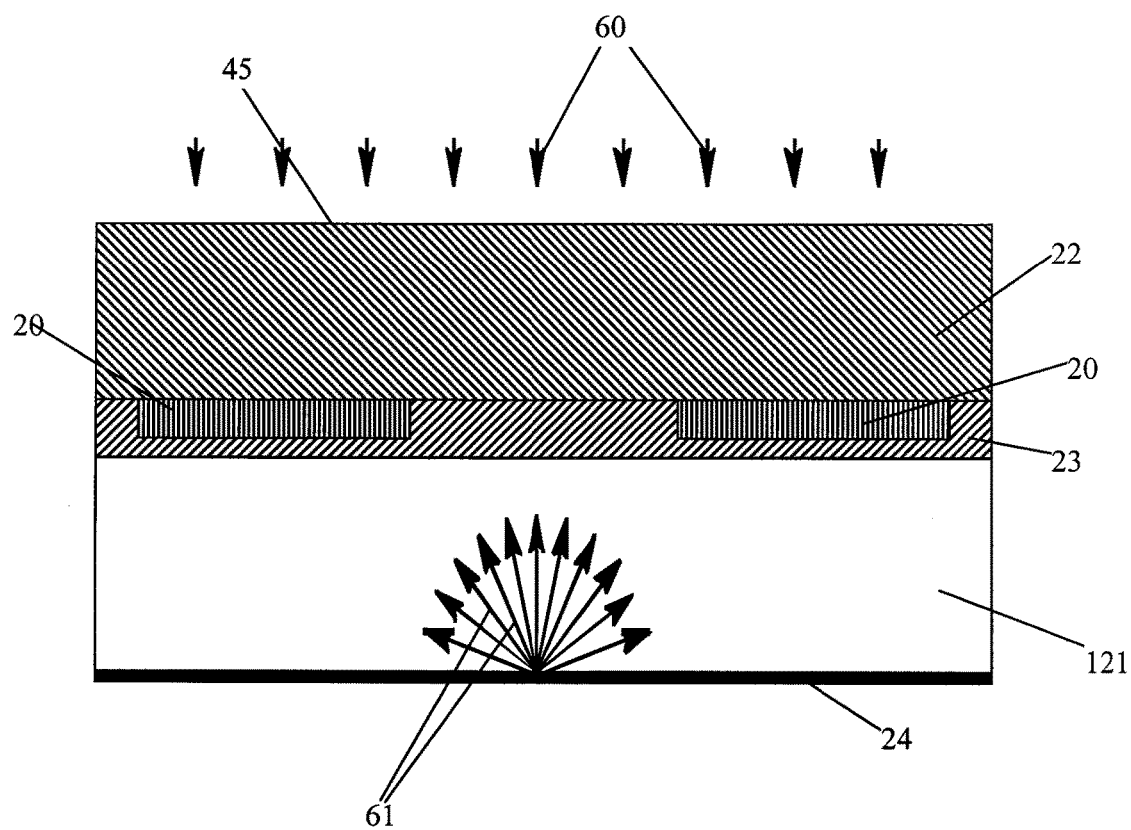
FIG. 15 is a schematic diagram showing a cross-sectional view of silicon strips mounted on a suitable substrate and positioned adjacent to another light concentrator to concentrate sunlight onto the strips.

FIG. 15 shows a cross sectional view of another possible concentrator structure. Cells 20 are mounted on a glass superstrate 22 using a suitable optical adhesive. Cells 20 have been electrically connected to each other by a suitable combination of series and parallel connections (not shown). A suitable transparent substrate 21, such as glass, has been applied and the space between cells 20 and substrate 21 has been filled with a suitable pottant 23, such as ethyl vinyl acetate (EVA) or a silicone. A highly reflective lambertian (diffuse) reflector 24, such as a suitable white paint, has been applied to the rear surface. Sunlight 60 which passes through the space between cells 20 will be reflected off rear reflector 24 as shown at 61 and have a second chance at being absorbed by cells 20. Further, light that reaches the front air-glass interface 45 may be reflected back into superstrate 22 if it strikes interface 45 at greater than the critical angle, thus giving it yet another chance at being absorbed by cells 20.

Figure 16:
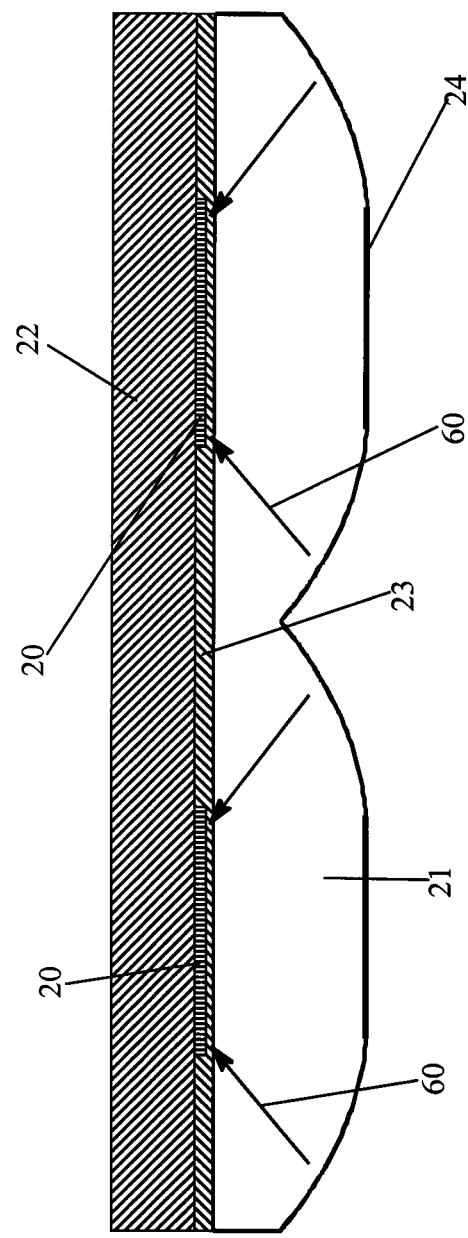
FIG. 16 is a schematic diagram showing a cross-sectional view of silicon strips mounted on a suitable substrate and positioned adjacent to another light concentrator to concentrate sunlight onto the strips.

FIG. 16 shows a cross sectional view of another possible concentrator structure. Cells 20 are mounted on a glass superstrate 22 using a suitable optical adhesive. Cells 20 have been electrically connected to each other by a suitable combination of series and parallel connections (not shown). A suitable transparent substrate 21, such as acrylic, has been applied and the space between cells 20 and substrate 21 has been filled with a suitable pottant 23, such as ethyl vinyl acetate (EVA) or a silicone. The rear side of substrate 21 has been shaped using a suitable process such as injection moulding and a suitable reflective material, such as silver, has been applied. The resulting reflector 24 has been aligned to cells 20. Reflector 24 is designed and positioned in such a way that most of the sunlight 60 that passes through the space between cells 20 will be reflected onto cells 20.

In order to maximise the efficiency of silicon solar cells, it is important to maximise the amount of light with a wavelength less than 1100 nm absorbed in the silicon. There are two mechanisms which can reduce the amount of light absorbed. Light may be reflected off the silicon surface, or it may enter the silicon and exit the silicon again some time later without having been absorbed. Both these loss mechanisms can be reduced by roughening, or texturing, the silicon surface. This reduces reflection losses by increasing the probability that a light ray will strike the silicon surface multiple times, and it reduces absorption losses by confining the light within the silicon.

A texturing technique which can be used for single crystal silicon of (100) orientation is to etch the silicon in a solution of potassium hydroxide (KOH) and isopropyl alcohol (IPA). This results in a surface covered in square base pyramids. However, this approach cannot be used for the case where the silicon strips are created by KOH etching, as in this case the surfaces of the strips have a (111) crystallographic orientation. Several other texturing techniques are currently under development which do not rely on a particular crystallographic orientation, such as the use of reactive ion etching (RIE). However, these techniques may prove to be expensive or to lead to other disadvantages, such as increased carrier recombination at the silicon surface. Further, these techniques are only suitable for the texturing of flat wafers and cannot be applied to the texturing of silicon strips which are held in a wafer frame, such as strips produced as part of a process of the present invention.

Figure 17:
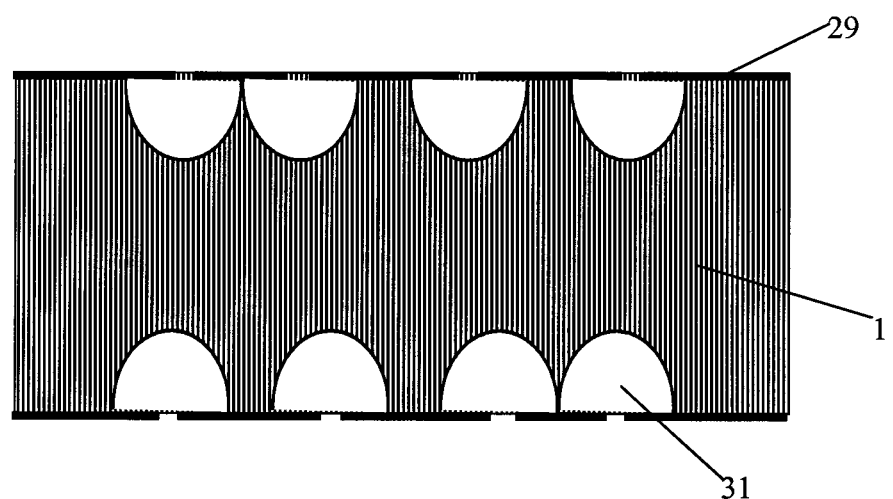
FIG. 17 is a schematic diagram of a silicon strip following surface texturing as described herein.

FIG. 17 shows a cross sectional view of a silicon strip 1 following texturing. The texturing process is as follows. A thin layer of silicon nitride 29 is deposited on the silicon strip substrate 1 by low pressure chemical vapour deposition (LPCVD). This technique results in a uniform and conformal layer of silicon nitride 29 over the substrate surface. Importantly, silicon nitride 29 is also deposited by LPCVD down narrow channels or slots and onto the sidewalls of silicon strips created by one of the techniques described above. Only a very thin layer of silicon nitride, of the order of several atomic layers thick, is deposited. Such a layer is sufficiently thin that it contains some holes through which the silicon substrate is exposed. Strip 1 is then etched in a suitable etchant, such as a solution of 1:50 hydrofluoric: nitric acid. At room temperature, this solution etches silicon nitride about 3000 times slower than silicon. Consequently, etch pits 31 will form in the silicon of strip 1. After several minutes, most of the surface will be covered in etch pits 31 up to several microns in size. Etching is now terminated. Control of the etching process can be achieved by varying the silicon nitride deposition parameters, which may influence the density of holes in the layer, and by varying the etch time and temperature. If a lower etch temperature is used, a lower etch rate of silicon nitride 29 compared to silicon 1 can be obtained. For example, at 0° C., the etch solution etches silicon nitride 29 about 6000 times slower than silicon. It is also possible to carry out the above texturing process twice in order to obtain a further improvement in the texture properties.

The above texturing technique is particularly advantageous for thin film silicon cells since it only consumes a small amount of silicon in the texturing process (approximately 2-3 microns on each textured surface). The texturing technique can be applied to silicon wafers or films of arbitrary grain size.

The etching of deep grooves with vertical sidewalls into (110) silicon wafers has been reported extensively in the literature. For narrow grooves of several hundred microns depth, it is often found difficult to maintain a uniform groove depth and a reasonable etch rate. Two possible reasons for this are the formation of hydrogen bubbles which adhere to the sidewalls of the grooves and prevent etching in the regions around the bubbles, and the lack of supply of fresh etchant to the bottom of the grooves. Several methods have been discussed in the literature which may improve the etch rate and uniformity of deep grooves, such as the use of ultrasonic agitation and stirring. However, stirring of the solution does not result in a substantial improvement in the etch behavior of deep grooves, while ultrasonic agitation often leads to the destruction of fine features.

We now describe another technique for the etching of deep narrow grooves. This technique consists of periodically removing the wafer from the solution and then reinserting it. In a typical treatment, etching is done with a 44 wt % solution of KOH at 85° C. for 5 hours. The wafers are placed in an assembly which holds them in place, typically at an angle of about 45° to the horizontal. The assembly lowers the wafer into the solution and leaves it immersed for 5 minutes. Then, the wafers are raised above the solution and left in this position for 5 minutes. Now the cycle is repeated by again lowering the wafers into the solution.

The technique described above was applied to a silicon wafer having grooves whose initial width was 10 microns. A 5 hour etch resulted in approximately 10 microns lateral etching so that the final groove width was 20 microns. Depth variation was found to be less than 40 microns at the end of the 5 hrs etching. The minimum and maximum groove depth was at 340 and 380 µm respectively. An experimental evaluation showed that 60% of grooves etched to a depth range of 350-360 microns, 15% etched to a depth of 340 and the remaining 25% etched to a depth range of 370-380 microns. A 0.5 mm thick piece of silicon was entirely etched through in a time of 6 hours and 30 minutes.

EXAMPLES

Example 1

Fabrication of Solar Cell

Solar cells have been fabricated as follows. 0.5 Ohm-cm, boron doped float-zoned wafers, 100 mm in diameter and 0.8 mm thick, were used as the starting material. The wafers were etched to remove any surface damage. A phosphorus diffusion was made into one side of the wafer (the top side) to a sheet resistance of approximately 50 ohm/square, followed by a boron diffusion into the rear side to about 50 ohm/square. A 100 nm thick oxide was grown on both surfaces, followed by deposition of 50 nm of silicon nitride. Cuts were made into the wafers from the top side using a dicing saw, with the cuts extending to within approximately 50 microns of the rear surface, to create silicon strips. The wafers were then given an etch in potassium hydroxide solution to remove any damage resulting from the cutting process. A phosphorus diffusion was then made into the grooves to about 100 ohm/square. An oxide was grown on the sidewalls of the strips to a thickness of 200 nm. A second set of cuts was then made on a dicing saw into the rear of the wafer, aligned to the first set of cuts and of sufficient depth to create cuts extending all the way through the wafer. The wafers were again immersed in a potassium hydroxide solution to remove any damage from the cuts. An oxide of 275 nm thickness was then grown on the freshly exposed silicon surfaces, increasing the thickness of the sidewall oxide to 300 nm. The silicon nitride layers on the front and rear of the wafer were now removed using phosphoric acid at 165° C. The wafers were then immersed in a solution of 10% hydrofluoric acid in water until the oxide had been removed from the top and rear surfaces of the wafer. At this stage, an oxide of approximately 180 nm thickness was still present on the sidewalls of the silicon strips. The wafers were now metallized. Silver was then electroplated onto the contacts to a thickness of approximately 4 microns. Finally, the silicon strips were cut out using a dicing saw. Silicon strips having thicknesses ranging from less than 100 microns to 250 microns have been made in this way.

One hundred and fifty silicon strips were connected together in series as follows. The strips were butted against each other and placed into a suitable plating jig. They were shorted together by applying silver paint along one edge of the assembly of strips. The cells were then silver plated. This resulted in a silver deposit creating an electrical and physical connection between adjoining strips. Following plating, the edges of the resulting cell to which silver paint had been applied were cut off with a dicing saw. The resulting cell was mounted on glass using heat activated adhesive. A 53 cm$^2$ cell was manufactured in this way. The cell had an efficiency of 13.4% with an open circuit voltage of 92V, a current of 10.3 mA and a fill factor of 73%.

Example 2

Texturing Polished Silicon Surface to Decrease Reflectivity

A silicon nitride layer approximately 2 nm thick was deposited at 750° C. on a polished silicon wafer of (111) orientation, using low pressure chemical vapour deposition. A sample was cut out of the wafer and etched in a solution of 1:50 hydrofluoric acid:nitric acid for 150 seconds at 0° C. The sample was encapsulated behind 1 mm thick low iron glass using silicone and its reflectance was measured using a spectrophotometer with an integrating sphere. The sample had a reflectivity of 11% at 900 nm, while a polished encapsulated silicon reference wafer had a reflectivity of 24% and a sample of (100) oriented silicon textured with inverted pyramids had a reflectivity of 8% at the same wavelength. These results indicate that the texturing process is very effective at reducing reflection from the silicon surface. The results also indicate that the texture is likely to be very effective at confining light within the silicon.

Advantages of the Processes of the Present Invention Over Prior Art Industrial Silicon Solar Processing Techniques The processes of the present invention provide a greater surface area of solar cell per unit length of ingot material, compared to prior art methods. For example, next generation crystalline silicon (c-Si) solar cells will be around 0.2 mm thick. Kerf losses are around 0.25 mm, resulting in a total thickness of about 0.45 mm of ingot consumed per wafer. In accordance with the present invention, if strips are cut at a pitch of 0.1 mm from a 1 mm thick wafer, then this provides an effective surface area which is ten times the area of the original wafer, for a consumption of 1.25 mm of ingot. So the amount of ingot consumed per equivalent wafer area would be 0.125 mm and the gain would be a factor of 3.6 (that is, 0.45/0.125). The inclusion of a silicon frame around the periphery of the wafer would reduce this gain slightly. This area gain can be extended further by concentrating the sunlight directed onto solar cells made from the strips.

In the methods of the present invention, a solar cell fabrication process can be carried out while the strips remain attached to the wafer. For each wafer processed, and using the above example, effectively ten times the area of the wafer is being processed, reducing processing costs. In general, the thickness of the wafer should be greater than the sum of the width of each strip and the width of silicon removed in order to achieve a net gain in planar surface area.

Monolithic interconnection results naturally from the processes of the present invention. This is desirable as it lends itself more easily to automated production than the conventional cell interconnection process. Cells can also be connected in series, giving a high voltage, small current device which is also desirable.

The invention also allows very simple, yet highly effective static concentrator designs to be implemented, which allow concentration of sunlight by a factor of two or more. This means that only about one half or less of the surface of a module must be covered in solar cells. There are two basic reasons why solar cells produced by the processes of the present invention are better suited to static concentrator designs than solar cells of the prior art.

The first reason is that cells produced by the processes of the present invention are bifacial—that is, they respond equally well to sunlight impinging on either surface. Standard solar cells of the prior art are not bifacial and only respond to sunlight impinging on one surface. The most effective static concentrator designs require bifacial cells.

The second reason is that cells produced by the processes of the present invention can be very narrow—of the order of 1 mm is typical. The height of static concentrators is directly proportional to the width of the cell. Standard solar cells of the prior art, made from wafers, are typically 10×10 cm$^2$ or larger, and therefore static concentrator systems made with such cells are large and bulky.

Many modifications of the processes described herein with reference to the accompanying drawings will be apparent to those skilled in the art without departing from the scope of the present invention.

What is claimed:

1. A device comprising an arrangement of elongated semiconductor strips, each strip having a width defining a face, each strip having a length greater than their width, and a thickness less than the width, wherein the strips are mounted on a substrate or superstrate with an adhesive.

2. A device according to claim 1 further comprising electrical connection of the strips.

3. A device according to claim 2 wherein the electrical connections are formed in series or parallel or a combination of series and parallel.

4. A device according to claim 2 wherein the electrical connections are formed with an electrical conductive material.

5. A device according to claim 4 wherein the electrically conductive material is one of solder, conductive ink or conductive adhesive.

6. A device according to claim 1 wherein there are gaps between the strips.

7. A device according to claim 6 wherein the gaps are between 0 and 3 times the width of the strips.

8. A device according to claim 2 wherein the strips are solar cells.

9. A device according to claim 8 wherein the device is a solar module.

10. A device according to claim 1 wherein the strips are separated from a semiconductor wafer.

11. A device according to claim 10 wherein the strips have been formed by forming slots in the semiconductor wafer.

12. A device according to claim 1 wherein the adhesive is an optical adhesive.

13. A device according to claim 1 wherein the strips are mounted on the substrate by the adhesive between the faces of the strips and the substrate.

14. A device according to claim 1 wherein the width of each of the strips is between 0.5 mm and 1 mm.

15. A device according to claim 1 wherein the length of each of the strips is greater than 10 mm.

16. A solar cell module comprising:
a plurality of very narrow individual bifacial solar cells composed of multicrystalline silicon or single crystal silicon, and
a support substrate adapted to support each of the solar cells in an orientation allowing at least one of the front and rear faces of each of the solar cells to be exposed to solar radiation, the solar cells being mounted on the support substrate with an adhesive;
wherein the first and second metal contacts of each of the solar cells are electrically interconnected.

17. A solar cell module according to claim 16 wherein each of the plurality of solar cells is oriented on the support substrate wherein adjacent oriented solar cells are spaced apart, the spacing being from zero up to about 3 times the width of each solar cell.

18. A solar cell module according to claim 17 further comprising a rear reflector spaced from the rear faces of the solar cells, the rear reflector being oriented relative to the rear faces of the solar cells to reflect incident light passing through the gaps between adjacent solar cells toward the rear face of at least one of the solar cells.

19. A solar cell module according to claim 18 further comprising a transparent superstrate having an optically reflective surface spaced from the front faces of the solar cells and oriented relative to the front faces of the solar cells wherein incident light reflected from the solar cells or from the rear reflector and passing through the gaps between adjacent solar cells, is reflected toward the front face of at least one of the solar cells.

20. A solar cell module according to claim 16 further comprising a transparent superstrate located in front of the solar cells, a transparent substrate located on the rear side of the solar cells and a pottant filling a space between the substrate, the solar cells and the superstrate.

21. A solar cell module according to claim 16 wherein the support substrate comprises a light-transparent superstrate having a front face upon which light is incident in use, the solar cells being supported by the superstrate at positions spaced from the front face, the solar cells being positioned such as to leave gaps between adjacent solar cells, the module further comprising a rear reflector located at the rear of the solar cells and spaced therefrom for reflecting incident light that, in use, has passed through the gaps or that has entered the solar cells and has exited them again without having been absorbed, wherein each of the solar cells is oriented such that the front faces of the solar cells are adapted for receiving incident light and the rear faces of the solar cells are adapted for receiving light reflected from the rear reflector.

22. A solar cell module according to claim 21 wherein in use, light reflected from either the solar cells or the rear reflector is further reflected by the front face of the superstrate to a front face of at least one of the solar cells.

23. A solar cell module according to claim 21 further comprising a light transparent substrate on the rear side of the solar cells, and a pottant material to fill a space between the superstrate, the solar cells and the substrate.

24. A solar cell module according to claim 18 wherein the rear reflector is a layer of reflective material extending through at least a portion of the support substrate or applied to at least a portion of a rear surface of the support substrate.

25. A solar cell module according to claim 24 wherein the layer of reflective material has a lambertian surface facing the solar cells.

26. A solar cell module according to claim 16 wherein the width of each of the very narrow solar cells is of the order of 1 mm and the length of each of the cells is greater than 10 mm.

* * * * *